United States Patent
Pfirsch et al.

(10) Patent No.: US 11,469,317 B2
(45) Date of Patent: Oct. 11, 2022

(54) RC IGBT

(71) Applicant: Infineon Technologies Austria AG, Villach (AT)

(72) Inventors: Frank Dieter Pfirsch, Munich (DE); Erich Griebl, Dorfen (DE); Viktoryia Lapidus, Munich (DE); Anton Mauder, Kolbermoor (DE); Christian Philipp Sandow, Haar (DE); Antonio Vellei, Villach (AT)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 17/203,194

(22) Filed: Mar. 16, 2021

(65) Prior Publication Data

US 2021/0296479 A1     Sep. 23, 2021

(30) Foreign Application Priority Data

Mar. 17, 2020 (DE) .......................... 102020107277.5

(51) Int. Cl.
*H01L 29/739* (2006.01)
*H01L 29/66* (2006.01)
*H01L 29/06* (2006.01)
*G06F 30/398* (2020.01)

(52) U.S. Cl.
CPC ........ *H01L 29/7397* (2013.01); *G06F 30/398* (2020.01); *H01L 29/0696* (2013.01); *H01L 29/66348* (2013.01)

(58) Field of Classification Search
CPC ............. H01L 29/7397; H01L 29/0696; H01L 29/66348
USPC ...................................................... 257/140
See application file for complete search history.

(56) References Cited

U.S. PATENT DOCUMENTS

| | | | |
|---|---|---|---|
| 2016/0247808 A1* | 8/2016 | Horiuchi | H01L 29/0839 |
| 2019/0221658 A1* | 7/2019 | Yoneda | H01L 27/0716 |
| 2019/0312029 A1* | 10/2019 | Shirakawa | H01L 29/417 |
| 2020/0303528 A1* | 9/2020 | Thees | H01L 29/66068 |

* cited by examiner

*Primary Examiner* — Igwe U Anya

(74) *Attorney, Agent, or Firm* — Murphy, Bilak & Homilier, PLLC

(57) ABSTRACT

An RC IGBT includes, in an active region, an IGBT section and at least three diode sections. The arrangement of the diode sections obeys a design rule.

20 Claims, 13 Drawing Sheets

RC IGBT

TECHNICAL FIELD

This specification refers to embodiments of a power semiconductor device and to embodiments of a method of processing a power semiconductor device. In particular, this specification is related to embodiments of an RC IGBT and to embodiments of a corresponding processing method, wherein several diode sections of the RC IGBT are arranged in the active region according to a design rule.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state. In some cases, the gate electrode may be included within a trench of the power semiconductor switch, wherein the trench may exhibit, e.g., a stripe configuration or a needle configuration.

Some power semiconductor devices further provide for a reverse conductivity; during a reverse conducting state, the power semiconductor device conducts a reverse load current. Such devices may be designed such that the forward load current capability (in terms of magnitude) is substantially the same as the reverse load current capability.

A typical device that provides for both forward and reverse load current capability is the reverse conducting (RC) IGBT, the general configuration of which is known to the skilled person. Typically, for an RC IGBT, the forward conducting state is controllable by means of providing a corresponding signal to the gate electrodes, and the reverse conducting state is typically not controllable, but the RC IGBT assumes the reverse conducting state if a reverse voltage is present at the load terminals due to a one or more diode structures in the RC IGBT.

It is of course possible to provide a reverse current capability by means of a separate diode; e.g., a diode connected anti-parallel to a regular (not reverse conducting) IGBT. The embodiments described herein, however, relate to the variant where both the IGBT structure and the diode structures are monolithically integrated within the same chip.

Typical design goals for such an RC IGBT include, for example, a low ohmic connection between the gate electrodes and a gate terminal of the RC IGBT receiving the gate signal as well as a low thermal resistance of the device both in forward and in reverse conducting state.

SUMMARY

According to an embodiment, an RC IGBT comprises an active region with an IGBT section and a plurality of at least three diode sections; an edge termination region surrounding the active region; a semiconductor body extending in both the active region and the edge termination region and having a frontside and a backside, the semiconductor body having a thickness, said thickness being the distance along the vertical direction from the frontside to the backside in one of the diode sections; a first load terminal and a control terminal, both at the semiconductor body frontside, and a second load terminal at the semiconductor body backside. Each of the diode sections is configured for conduction of a diode load current between the first load terminal and the second load terminal. The IGBT section is configured for conduction of a forward load current between the second load terminal and the first load terminal. The control terminal is electrically connected to an electrically conductive control runner structure being arranged at the semiconductor body frontside and extending along a course of a lateral circumference of the active region at least partially. A plurality of control trenches is arranged in parallel to each other along a first lateral direction and each control trench extends into the semiconductor body along a vertical direction pointing from the frontside to the backside. Each control trench has a stripe configuration extending along a second lateral direction from a respective first section of the lateral circumference towards a respective second section of the lateral circumference opposite of the respective first section, wherein the first lateral direction is perpendicular to the second lateral direction. Each control trench houses an insulated control electrode configured to receive a control signal via the control runner structure for controlling the IGBT section. Each of the control trenches is interrupted, along its respective extension in the second lateral direction, no more than once by at most a single one of the diode sections. Within the lateral area of the active region, neither the diode sections themselves laterally overlap with each other nor horizontal projections of these along the second lateral direction. Within the lateral area of the active region, horizontal projections of at least two of the diode sections along the first lateral direction do not overlap with each other.

According to another embodiment, a method of processing an RC IGBT comprises forming the following components of the RC IGBT: an active region with an IGBT section and a plurality of at least three diode sections; an edge termination region surrounding the active region; a semiconductor body extending in both the active region and the edge termination region and having a frontside and a backside, the semiconductor body having a thickness, said thickness being the distance along the vertical direction from the frontside to the backside in one of the diode sections; a first load terminal and a control terminal, both at the semiconductor body frontside, and a second load terminal at the semiconductor body backside. Each of the diode sections is configured for conduction of a diode load current between the first load terminal and the second load terminal. The IGBT section is configured for conduction of a forward load current between the second load terminal and the first load terminal. The control terminal is electrically connected to an electrically conductive control runner structure being arranged at the semiconductor body frontside and extending along a course of a lateral circumference of the active region at least partially. A plurality of control trenches is arranged in parallel to each other along a first lateral direction and each control trench extends into the semiconductor body along a vertical direction pointing from the frontside to the backside. Each control trench has a stripe configuration extending along a second lateral direction from a respective first section of the lateral circumference towards a respective second section of the lateral circumference opposite of the respective first section, wherein the first lateral direction is perpendicular to the second lateral direction. Each control trench houses an insulated control electrode configured to receive a control signal via the control runner structure for controlling the IGBT section. The processing method comprises obeying a design rule according to which: Each of the control trenches is interrupted, along its respective extension in the second lateral direction, no more than once by at most a single one of the diode sections. Within the lateral area of the active region, neither the diode sections themselves laterally overlap with each other nor horizontal projections of these along the second lateral direction. Within the lateral area of the active region, horizontal projections of at least two of the diode sections along the first lateral direction do not overlap with each other.

The proposed design rule includes the recognition that the above identified design goals may be achieved by a specific placement of the diode sections within the active region. For example, the proposed rule places the diode sections such that a low ohmic connection between the control electrodes in the IGBT section and the control runner structure as well as low thermal resistance for the diode sections is achieved.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
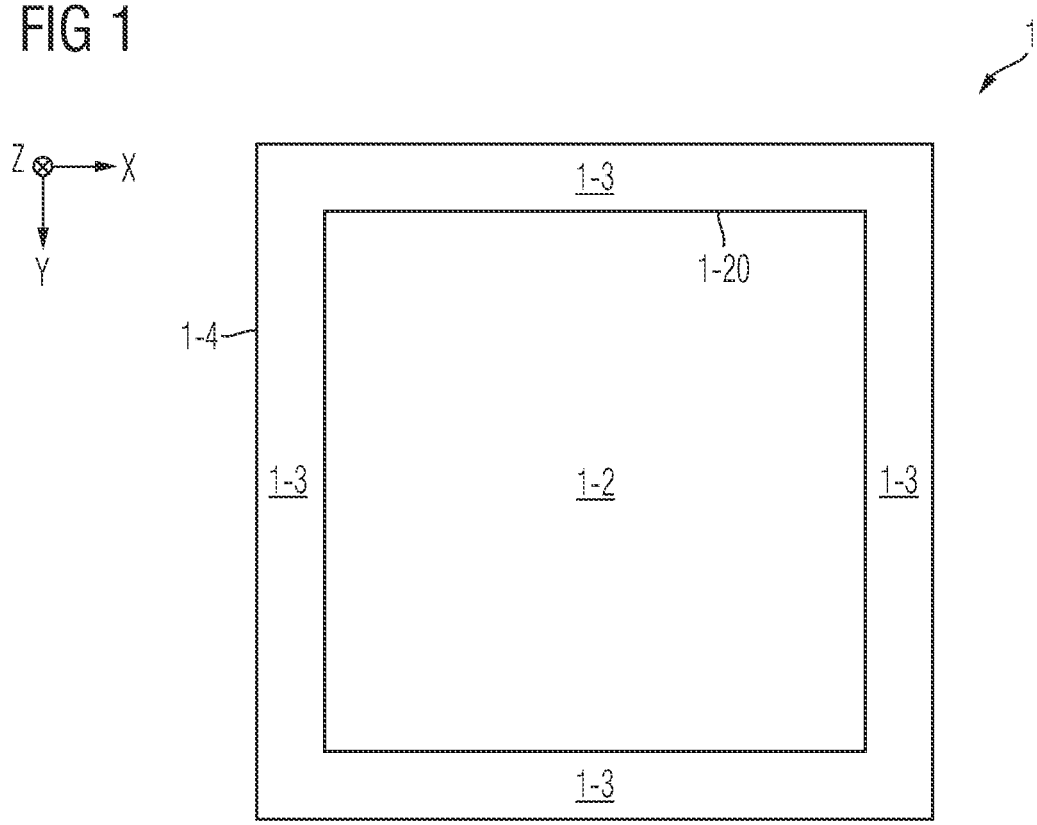
FIG. 1 schematically and exemplarily illustrates a section of a horizontal projection of an RC IGBT in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to an RC IGBT exhibiting a stripe cell configuration, e.g., an RC IGBT to be used within a power converter or a power supply. Thus, in an embodiment, such RC IGBT can be configured to carry a load current that is to be fed to a load and/or, respectively, that is provided by a power source. For example, the RC IGBT may comprise a plurality of power semiconductor cells, such as monolithically integrated diode cells, derivatives of a monolithically integrated diode cell, monolithically integrated IGBT cells and/or derivatives thereof. Such diode/transistor cells may be integrated in a power semiconductor module. A plurality of such cells may constitute a cell field that is arranged within an active region of the RC IGBT.

The term "RC IGBT" as used in this specification intends to describe a power semiconductor device on a single chip with high voltage blocking and/or high current-carrying capabilities. In other words, embodiments of the RC IGBT described herein are single chip power semiconductor devices configured for high current, typically in the Ampere range, e.g., up to several Ampere or up to several ten or hundred Ampere, and/or high voltages, typically 100 V and above, e.g., up to at least 400 V or even more, e.g., up to at least 3 kV, or even up to 10 kV or more.

For example, the RC IGBT described below may be a single chip power semiconductor device exhibiting a stripe cell configuration and configured to be employed as a power component in a low-, medium- and/or high voltage application. Several single chip power RC IGBTs may be integrated in a module so as to form an RC IGBT module, e.g., for installation and use in a low-, medium- and/or high voltage application, such as major home appliances, general purpose drive, electric-drive train, servo drives, traction, higher power transmission facilities, etc.

For example, the term "RC IGBT" as used in this specification is not directed to a logic semiconductor device used for, e.g., storing data, computing data and/or other types of semiconductor based data processing.

FIG. 1 schematically and exemplarily illustrates, in a simplified manner, a horizontal projection of an RC IGBT 1 in accordance with one or more embodiments. The RC IGBT 1 can for example be a single chip RC IGBT. Several of such single chip RC IGBTs may be integrated in a power RC IGBT module.

For describing the configuration of the RC IGBT 1, it will also be referred to FIGS. 2-5 in the following.

The RC IGBT 1 comprises an active region 1-2 with a plurality of at least three diode sections 1-22 and an IGBT section 1-21. Both the diode sections 1-22 and the IGBT section 1-21 are integrated within the same chip of the RC IGBT 1.

An edge termination region 1-3 surrounds the active region 1-2. The edge termination region 1-3 is arranged external of the active region 1-2. The edge termination region 1-3 is laterally terminated by an edge 1-4. The edge 1-4 may form the chip edge of the power semiconductor device 1, e.g., originating from a dicing/sawing processing step.

As used herein, the terms "edge termination region" and "active region" have the respective technical meaning the skilled person typically associates therewith in the context of power semiconductor devices, such as RC IGBTs. That is, the active region 1-2 is primarily configured for forward load current (i.e., "IGBT load current") and reverse load current (i.e., "diode load current") conduction and switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

The present specification primarily relates to the active region 1-2.

As will be elucidated in more detail below, the RC IGBT 1 can comprise the IGBT section 1-21 and a plurality of substantially equally configured diode sections 1-22. The different sections 1-21 and 1-22 may be laterally distributed within the active region 1-2, examples of such distribution being explained in more detail below.

In an embodiment, the active region 1-2 consists of the plurality of diode sections 1-22 and one IGBT sections 1-21.

But, it shall be understood that, in accordance with one or more embodiments described herein, none of the plurality of the diode sections 1-22 is integrated into the IGBT section 1-21; hence, the diode sections 1-22 and the IGBT 1-21 section are not intermixed with each other. For example, in an embodiment, the diode sections 1-22 do not comprise any semiconductor source regions (reference numeral 101) of the first conductivity type electrically connected to the first load terminal (reference numeral 11).

For example, the diode sections 1-22 (which are not integrated into/intermixed with the IGBT section 1-21 and which are not electrically connected to the first load terminal 11 via source regions 101 of the first conductivity type in an embodiment) make up a significant portion of the active region 1-2. Hence, each of the diode sections 1-22 mentioned herein may be a "larger-diode-only" portion of the active region 1-2, in accordance with an embodiment.

Irrespective of the chosen lateral-spatial distribution of the IGBT section 1-21 and diode sections 1-22, it may be ensured that, with respect to a volume of the active region 1-2, the ratio between the total of the IGBT section 1-21 and the total of the diode sections 1-22 is at least 1.5:1, or respectively, at least 2:1, i.e., larger or equal than 2:1. The chosen ratio may depend on the application in which the power semiconductor device 1 is employed. For example, irrespective of the chosen lateral-spatial distribution of the IGBT sections 1-21 and diode sections 1-22, it may be ensured that, with respect to a volume of the active region 1-2, the ratio between the IGBT section(s) 1-21 and the diode section(s) 1-22 is even larger than 3:1 or larger than 5:1.

In an embodiment, at least 75% of the total volume of the active region 1-2 may be occupied for forming the IGBT section 1-21, and the remaining 25% (or a lower percentage share) of the active region 1-2 may be employed for forming the diode sections 1-22.

In an embodiment, the total lateral area (horizontal cross-sectional area) of the diode sections 1-22 forms a portion of 5% to 40% of the total lateral area (horizontal cross-sectional area) of both the diode sections 1-22 and the IGBT section 1-21. Said lateral areas may be determined at a semiconductor body frontside 110.

Furthermore, each of the diode sections 1-22 may have a lateral area and a circumference defining the lateral area, wherein each diode section 1-22 obeys the relation that the square of the circumference divided by the area is smaller or equal to 20 or smaller or equal to 18.

In the following, reference will be also be made to "the" diode section 1-22 and "the" IGBT section 1-21. It shall be understood that the explanation provided below with respect to these sections 1-21 and 1-22 may apply to each section 1-21 or, respectively, each section 1-22 that are provided in the active region 1-2. For example, if more than one IGBT sections 1-21 is provided, each IGBT section 1-21 may be equally configured (wherein, for example, the IGBT sections 1-21 may differ from each other in total lateral extension or exhibit identical total lateral extensions). Accordingly, if a plurality of diode sections 1-22 is provided, each diode section 1-22 may be equally configured (wherein, for example, the diode sections 1-22 may differ from each other in total lateral extension or exhibit identical total lateral extensions).

Figure 2:
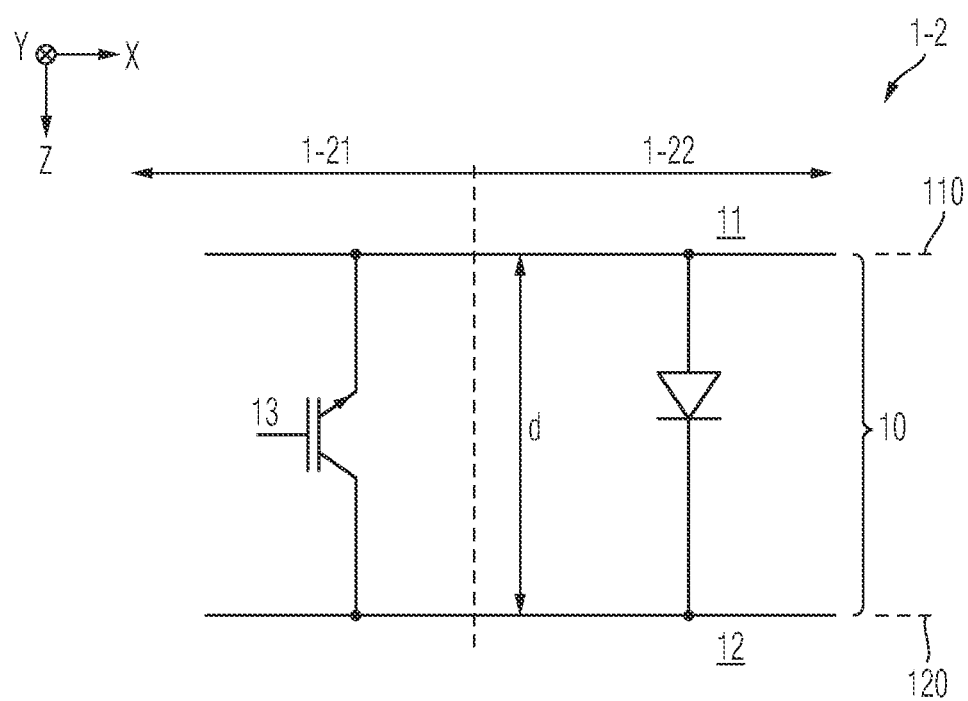
FIG. 2 schematically and exemplarily illustrates a simplified circuit design of an RC IGBT in accordance with one or more embodiments.

Now focusing also on FIG. 2, a semiconductor body 10 of the RC IGBT 1 extends in both the active region 1-2 and the edge termination region 1-3 and has said frontside 110 and a backside 120. The frontside 110 and the backside 120 may vertically terminate the semiconductor body 10. Hence, a thickness d of the semiconductor body 10 is defined as the distance along a vertical direction Z between the frontside 110 and the backside 120. In the lateral directions, the semiconductor body 10 may be terminated by the edge 1-4 (cf. FIG. 1). Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness d of the semiconductor body 10 may be the distance between the frontside 110 and the backside 120 along the vertical direction Z in one of the diode sections 1-22 in the active region 1-2.

In an embodiment, a total lateral extension of the IGBT section 1-21 amounts to at least 50% of the semiconductor body thickness d. The total lateral extension of the IGBT section 1-21 may also be greater than 50% of the thickness d, e.g., greater than 2*d, or even greater than 5*d.

In an embodiment, a total lateral extension of each of the diode sections 1-22 amounts to at least 20% of the semiconductor body thickness d. The total lateral extension of the diode section 1-22 may also be greater than 30% of the thickness d, e.g., greater than 0.5*d, or even greater than d. For example, the lateral area (horizontal cross-sectional area) of each of at least two of the diode sections 1-22 has a minimum lateral extension along the first lateral direction X and/or along the second lateral direction Y amounting at least to five times the semiconductor body thickness d.

Both a first load terminal 11 and a control terminal 13 (cf. FIG. 8) are at the semiconductor body frontside 110, and a second load terminal 12 is at the semiconductor body backside 120.

Figure 8:
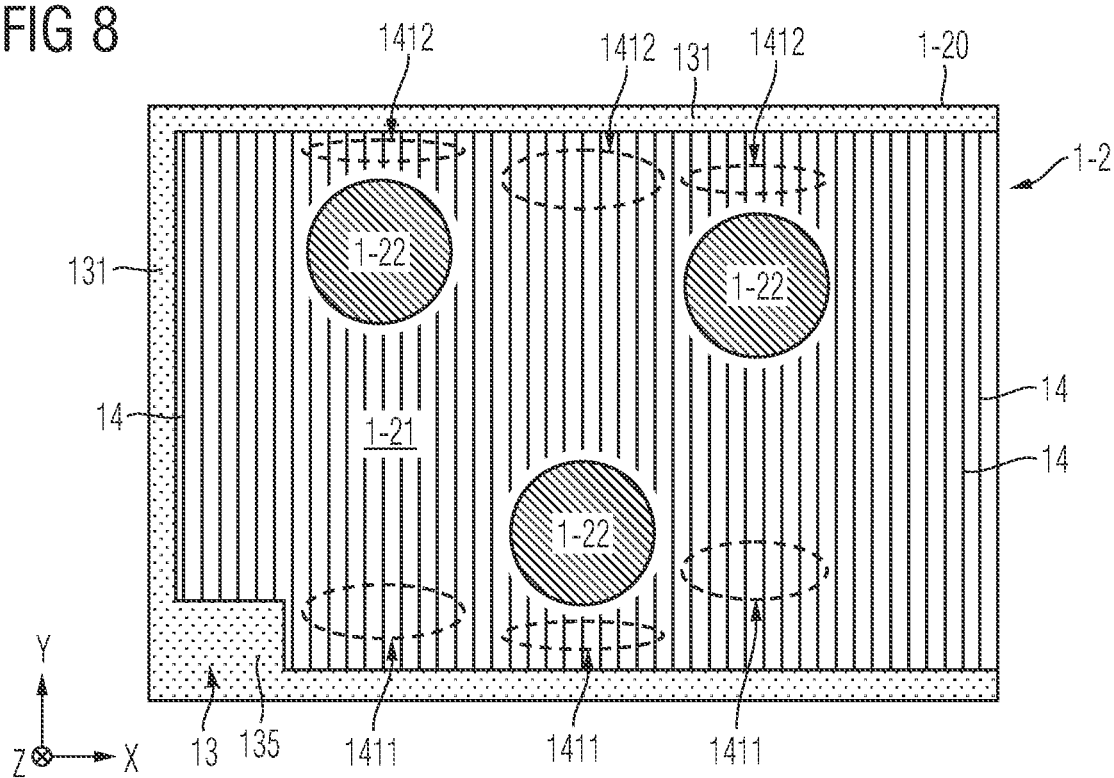
Figure 9:
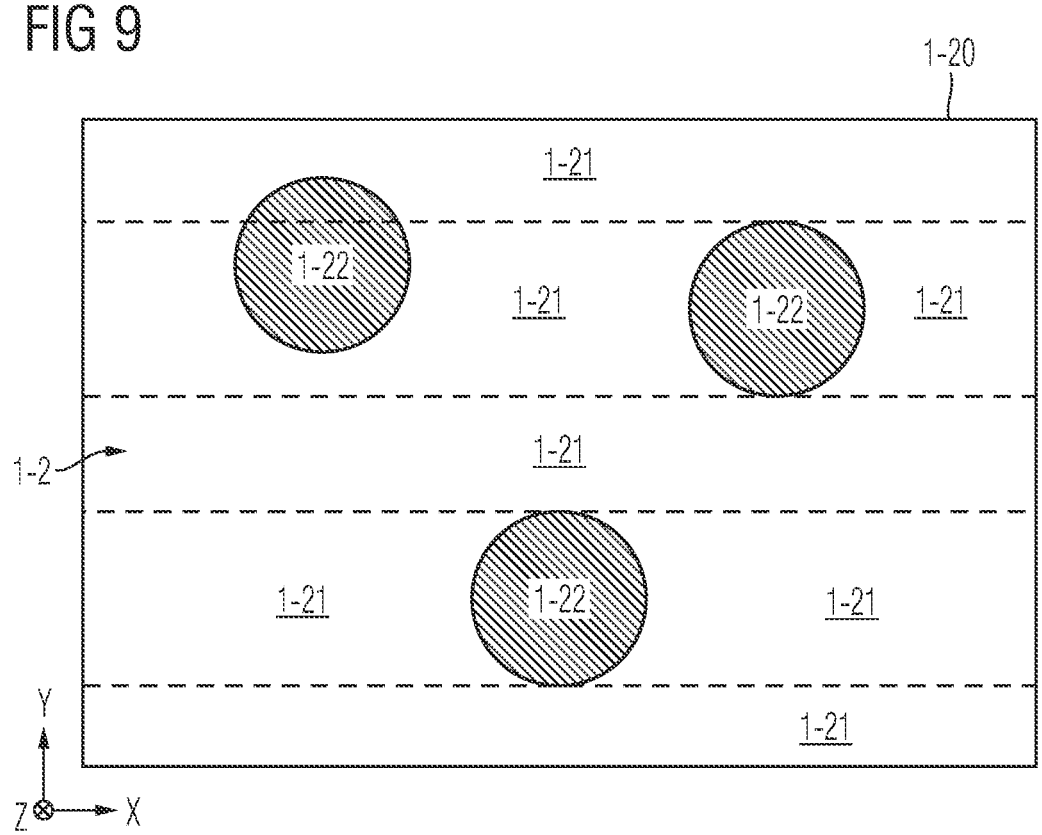

The IGBT section 1-21 is configured for conduction of a forward load current between the first load terminal 11 and the second load terminal 12, e.g., if the electrical potential at the second load terminal 12 is greater than the electrical potential at the first load terminal 11. For controlling the forward load current, the control terminal 13 is electrically connected to an electrically conductive control runner structure 131 being arranged at the semiconductor body frontside 110 and extending along a course of a lateral circumference 1-20 of the active region 1-2 at least partially, as illustrated in FIG. 8.

Figure 21:
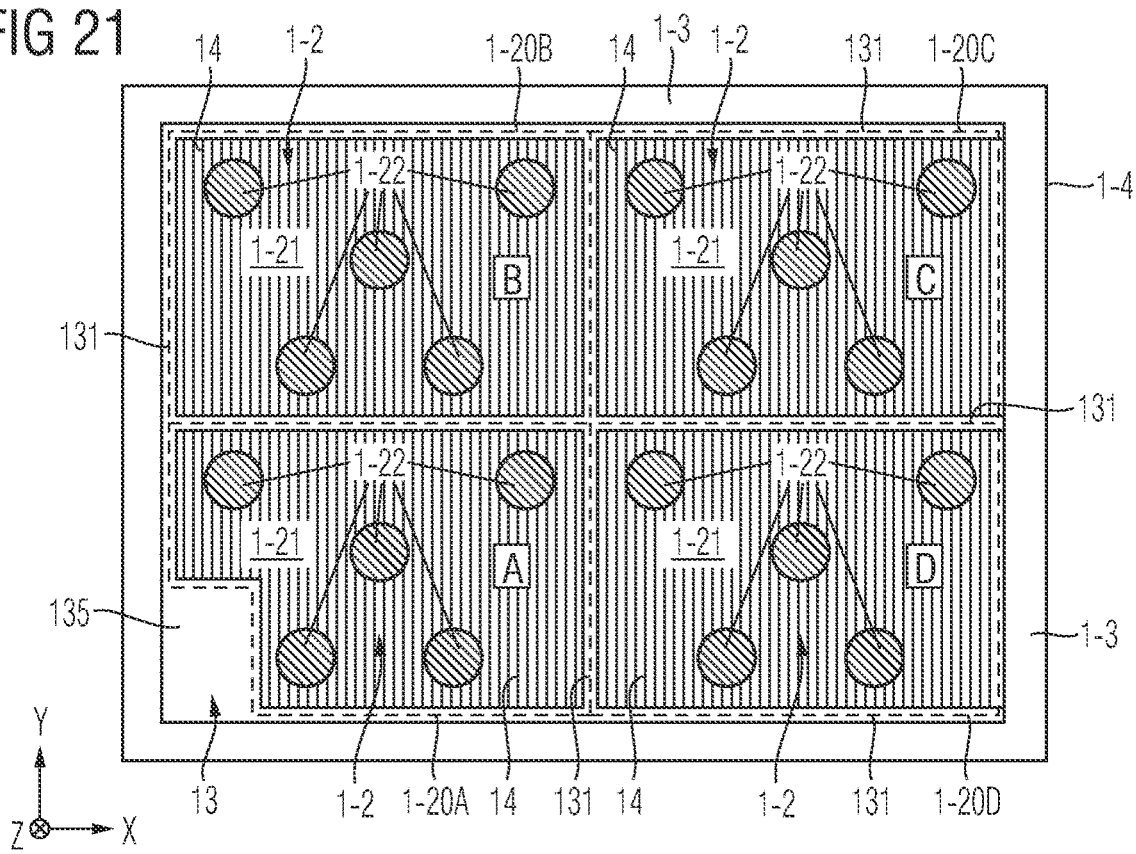

In an embodiment, the vertical projection of the lateral circumference 1-20 of the active region 1-2 defines the boundary between the active region 1-2 and the edge termination region 1-3 and/or an adjacent active region (cf. FIG. 21 and associated description).

Each of the diode sections 1-22 is configured for conduction of a diode load current (herein also referred to as "reverse load current") between the first load terminal 11 and the second load terminal 12, e.g., if the electrical potential at the second load terminal 12 is lower than the electrical potential at the first load terminal 11. The diode load current can hence be considered as a reverse load current.

In an embodiment, the diode sections 1-22, which conduct the diode load current, can be spatially separated from the IGBT section 1-21, which conducts the forward load current. As indicated above, the diode sections 1-22 are not part of the IGBT section 1-21, but separated therefrom, and do for example not include any source region 101 of the first conductivity type electrically connected to the first load terminal 11; rather, the diode sections 1-22 are "large diode-only regions" of the active region 1-2, in accordance with some embodiments.

For example, in an embodiment, a path of the forward load current formed in the semiconductor body 10 and a path of the diode load current formed in the semiconductor body 10 do not spatially overlap considerably with each other. For example, none or less than 20% or even less than 10% of the forward (IGBT) load current flows through the diode sections 1-22.

Furthermore, in an embodiment, the diode sections 1-22 are independent from a control signal (e.g., the control signal provided to control electrodes 141 mentioned below). For example, the diode section 1-22 may be configured such that it conducts the diode load current as soon as the electrical potential (of the typical polarity) at the second load terminal 12 is lower (at least by the diode section internal threshold voltage) than the electrical potential at the first load terminal 11, irrespective of the control signal provided to the IGBT section 1-21, that is, irrespective of the current potential of the control electrodes 141.

In accordance with the terminology typically associated with RC IGBTs, the control terminal 13 can be a gate terminal, the first load terminal 11 can be an emitter terminal and the second load terminal 12 can be a collector terminal.

For example, the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. For example, as exemplary illustrated in FIGS. 3 and 4, said local contacts can be established by means of first contact plugs 111 penetrating an insulation structure 19 so as to contact mesa portions 17 formed in the semiconductor body 10.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 laterally overlaps with the edge termination region 1-3.

For example, the lateral boundary of the active region 1-2 is defined by the lateral boundary of the outermost power cells of the IGBT section 1-21. Hence, the lateral boundary of the active region 1-2 may be defined at the frontside 110. For example, this lateral boundary can be defined by outermost source regions 101 (cf. explanation in more detail below). For example, all functional elements to enable conduction of the diode load current and the forward load current are present in a vertical projection of the active region 1-2 of the power semiconductor device 1, e.g., including at least a part of the first load terminal 11 (e.g., a frontside metal contact thereof, e.g., one or more of the first contact plugs 111), source region(s) 101, a body region 102, a drift region 100, a IGBT emitter region 103, a diode cathode region 104 and the second load terminal 12 (e.g., a backside metal thereof), as will be explained in more detail below.

In an embodiment, the edge termination region 1-3 and the active region 1-2 may be substantially symmetrically arranged, e.g., with respect to a central vertical plane of the RC IGBT 1.

Furthermore, the lateral transition (along the first or second lateral direction X; Y or combinations thereof) between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be theoretically observed at the backside 120, wherein the second load terminal 12 at the backside 120 is, e.g., laterally unstructured but homogeneously formed.

Figure 3:
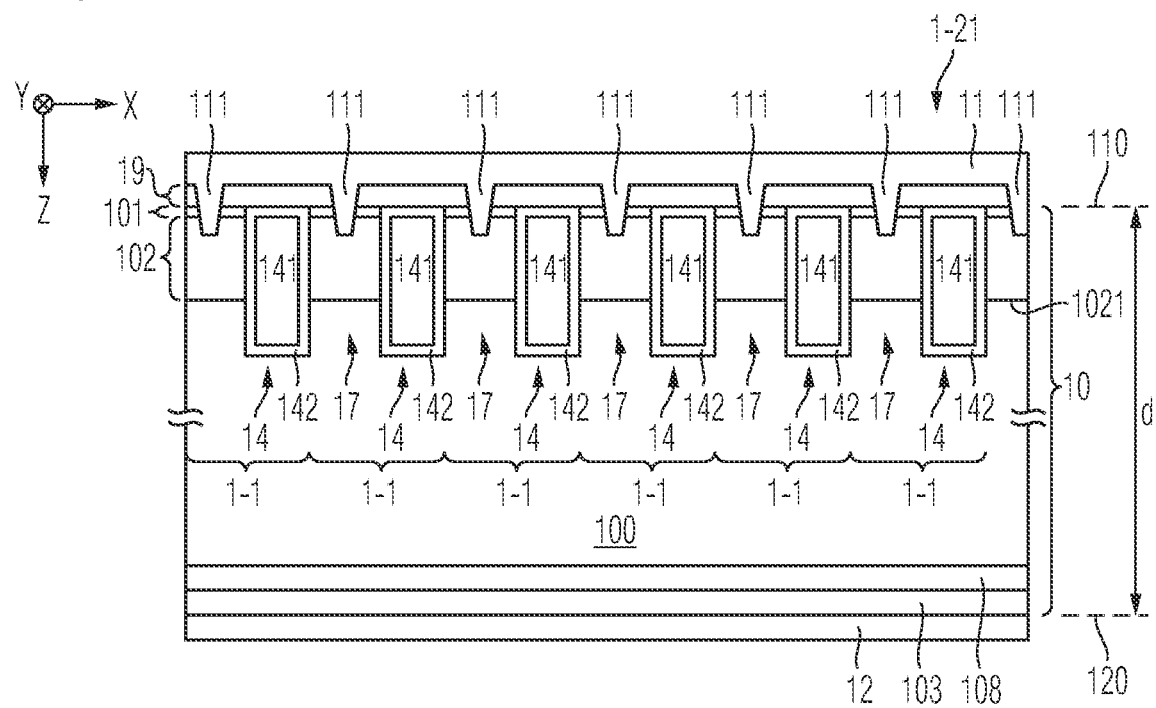
FIG. 3 schematically and exemplarily illustrates a section of a vertical cross-section of an IGBT section of an RC IGBT in accordance with one or more embodiments.
Figure 4:
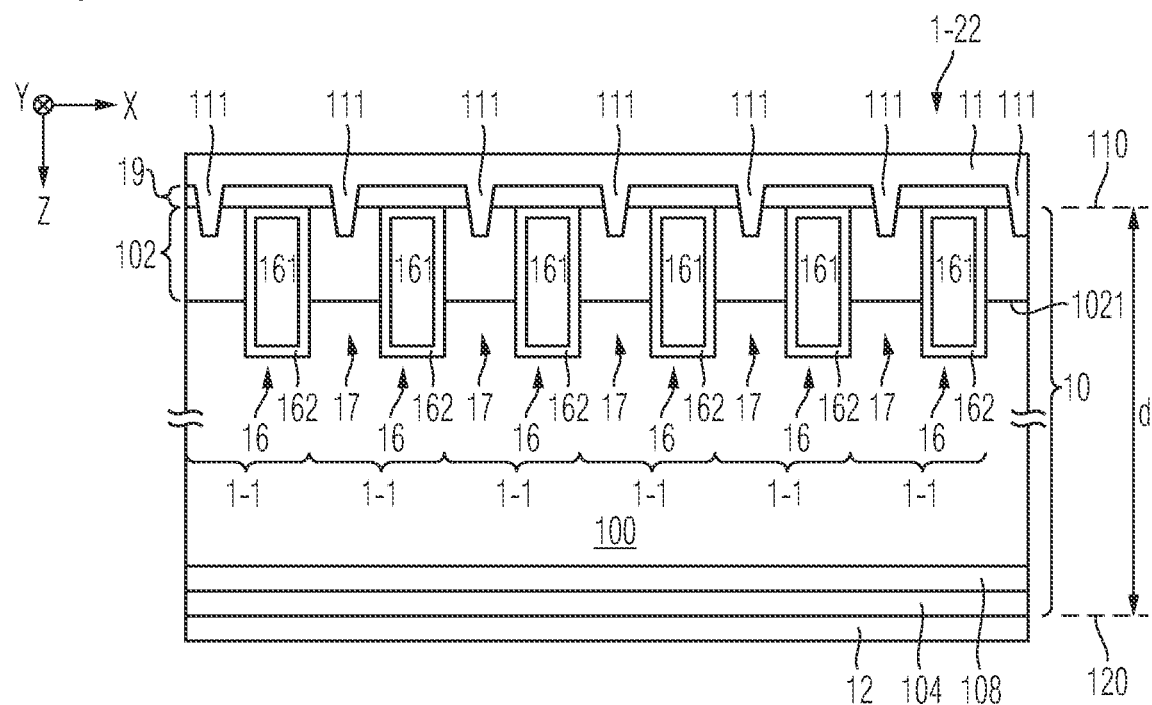
FIG. 4 schematically and exemplarily illustrates a section of a vertical cross-section of a diode section of an RC IGBT in accordance with one or more embodiments.
Figure 5:
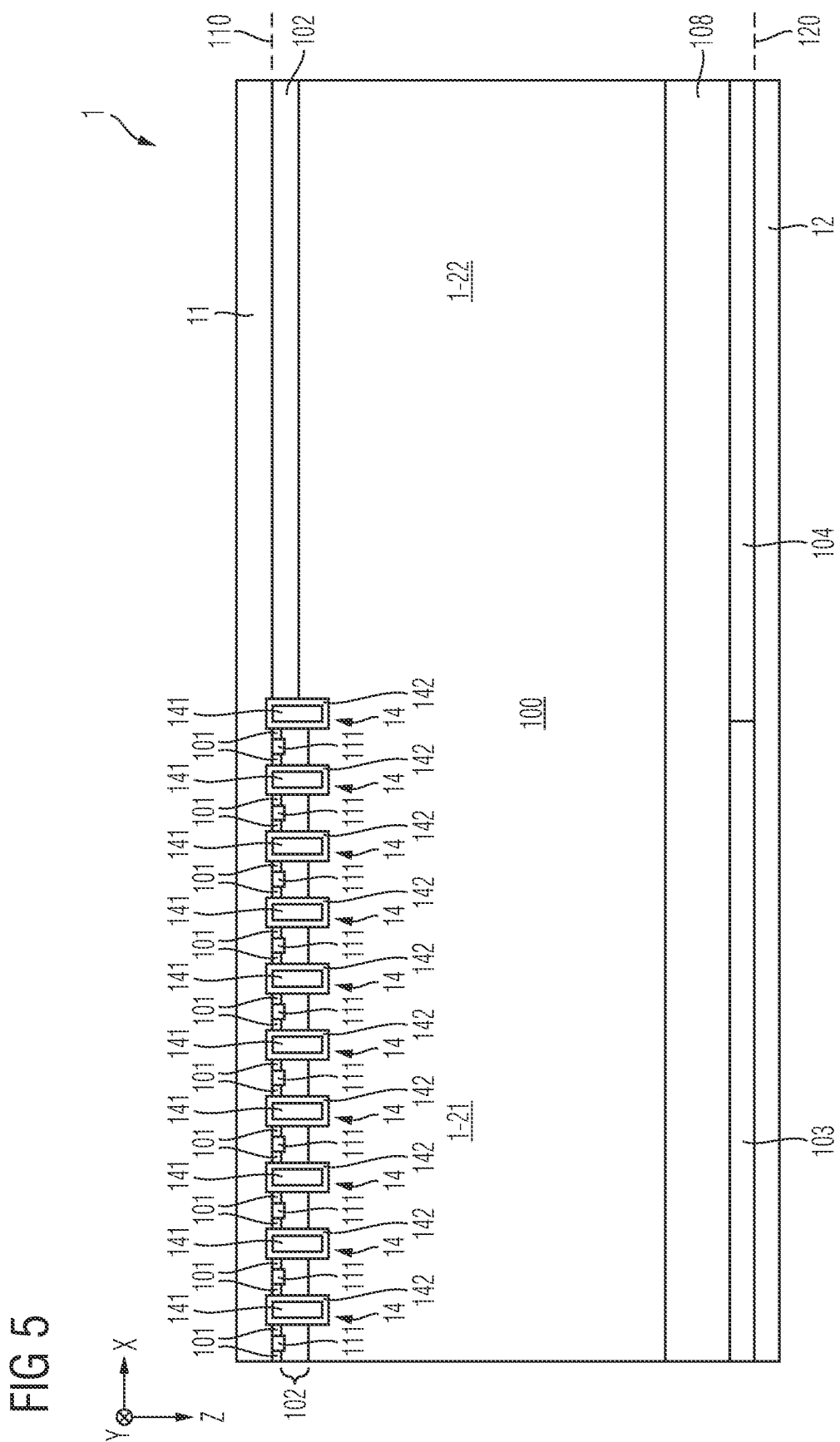
FIG. 5 schematically and exemplarily illustrates a section of a vertical cross-section of an RC IGBT in accordance with one or more embodiments.

Now referring to FIGS. 3 to 5 in more detail, a plurality of control trenches 14 is arranged in the IGBT section 1-21.

The control trenches 14 are arranged in parallel to each other along the first lateral direction X and extend into the semiconductor body 10 along the vertical direction Z. Each control trench 14 has a stripe configuration extending along the second lateral direction Y from a respective first section of the lateral circumference 1-20 (cf. FIG. 1) towards a respective second section of the lateral circumference 1-20 opposite of the respective first section. Each control trench 14 houses an insulated control electrode 141 configured to receive a control signal via the control runner structure 131 (cf., e.g., FIG. 6) for controlling the IGBT section 1-21.

The control electrodes 141 are isolated from the semiconductor body 10 by a respective trench insulator 142.

Two adjacent trenches 14 may define a respective mesa portion 17 in the semiconductor body 10.

Figure 6:
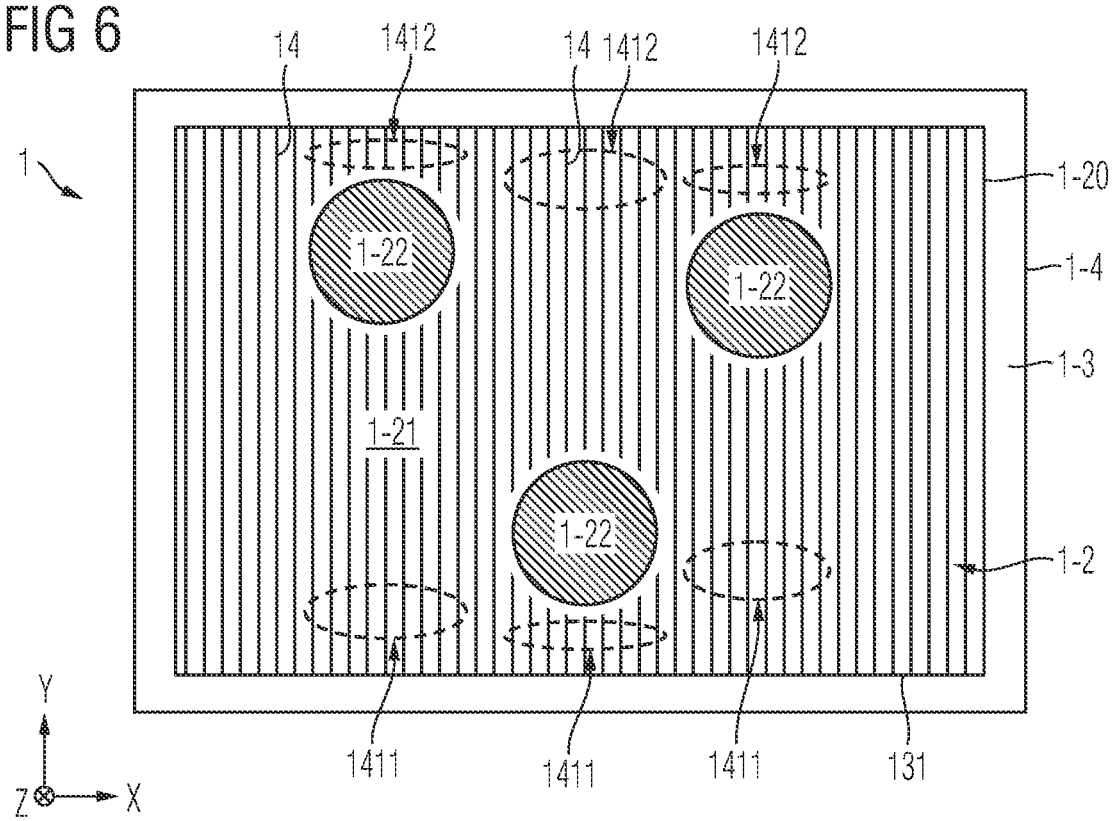
FIGS. 6-9 each schematically and exemplarily illustrate a section of a horizontal projection of an RC IGBT in accordance with one or more embodiments.

Each control trench 14 may have a stripe configuration, e.g., as best illustrated in one of the horizontal/perspective projections, e.g. in FIGS. 6 and 8, meaning that the respective trench length (e.g., along the second lateral direction Y) is much greater than the respective trench width (e.g., along the first lateral direction X).

As will be explained further below, further trenches may be provided that house trench electrodes having an electrical potential different from the electrical potential of the control electrodes 141.

A first type of trench can be the control trench 14, whose trench electrode 141 is electrically connected to the control terminal 13 and is hence referred to as control electrode 141.

A second type of trench can be a source trench 16, whose trench electrode 161 is electrically connected to the first load terminal 11 and is hence referred to as source electrode 161.

A third type of trench can be another trench, whose trench electrode is neither electrically connected to the first load terminal 11 nor to the control terminal 13. For example, in one embodiment, such trench is a floating trench and its trench electrode is connected to no defined electrical potential, but electrically floating. In another embodiment, such trench is a dummy trench and its trench electrode is electrically connected to the control terminal 13 but does not directly control conduction of the forward load current as no electrically connected source region 101 (connected to the first load terminal) is arranged adjacent to the third type trench. In yet another embodiment, the trench electrode of the third type trench is connected to an electrical potential different from the electrical potential of the control terminal 13 and different from the electrical potential of the first load terminal 11.

Each trench type can be of equal dimensions in terms of width (along the first lateral direction X) and depth (along the vertical direction Z, e.g., distance between frontside 110 down to trench bottom) and/or length (along the second lateral direction Y, wherein some trenches may be interrupted by the diode sections along their course in the second lateral direction Y as will be described below).

The IGBT section 1-21 may comprise a plurality of IGBT cells, each IGBT cell having a certain trench pattern, i.e., a lateral sequence (along the first lateral direction X) of trenches of specific types, e.g. one or more control trenches 14, zero or more source trenches 16 and zero or more other trenches.

Analogously, each of the diode sections 1-22 may comprise a number of diode cells, each diode cell having a certain trench pattern, i.e., a lateral sequence of trenches of specific types, e.g. zero or more source trenches 16 and/or zero or more other trenches.

In another embodiment, no trenches with trench electrodes are provided in the diode sections 1-22, e.g., such that each diode section 1-22 has only one diode cell (as for example illustrated in FIG. 5). In an embodiment, none of the diode sections 1-22 includes a trench with a trench electrode electrically connected to the control terminal 13. For example, none of the control trenches 14 extends into one or more of the diode sections 1-22. For example, the diode sections 1-22 are hence separated both from the IGBT section 1-21 and from the control trenches 14 (i.e., from the control trench electrodes 141), which may allow for achieving "good" diode properties, such as little or no dependence on the potential of the control electrodes 141 and/or low switching losses.

If trenches, e.g., trenches other than those whose trench electrodes are electrically connected to the control terminal 13, are provided in the diode sections 1-22, it may be provided that the trenches in both the IGBT section 1-21 and the diode sections 1-22 are laterally arranged next to one another in accordance with the same lateral trench pitch; i.e., the lateral trench pitch (that is, the distance along the first lateral direction X between two adjacent trenches) does not alter between the sections 1-21 and 1-22, in accordance with an embodiment.

The lateral trench pitch may, in an embodiment, define a lateral distance between two adjacent trenches of no more than 1/30 of the semiconductor body thickness d.

Also, the trenches 14, 16 may, in an embodiment, each exhibit the same trench depth (total vertical extension). For example, the lateral trench pitch may define a lateral distance between two adjacent trenches of no more than 50% or no more than 30% of the trench depth.

In an embodiment, the lateral trench pitch may define a lateral distance between two adjacent trenches of no more than 10 μm, or no more than 5 μm, 1 or no more than 1 μm. For example, adjacent trenches are hence laterally displaced from each other by no more than 1 μm.

Hence, the width of each mesa portion 17 is within the range as defined by the lateral trench pitch, at least in the IGBT section 1-21.

As explained above, the lateral trench pitch may be identical for both sections 1-21 and 1-22, or it varies between the sections. For example, the average density of trench electrodes can be also be same for both sections 1-21 and 1-22. However, the trench pattern, e.g., the arrangement of the different types of trenches may vary between the sections 1-21 and 1-22. One exemplary variation is that the density of control electrodes 141 in the IGBT section 1-21 is at least twice as high as the density of control electrodes 141 in the diode section 1-22 (which may even amount to zero).

In an illustrative example, the total number of trench electrodes in the IGBT section 1-21 is 120, and 40 trench electrodes are control electrodes 141, yielding a control electrode density of 30%. For example, the total number of trench electrodes in the diode section 1-22 is 100, and no more than ten trench electrodes are control electrodes 141, yielding a control electrode density of no more than 10%. In an embodiment, said trench electrodes in the diode sections 1-22 do not include any control trench electrode 141.

In an embodiment, at least 50% of the trench electrodes of the trenches in the diode section 1-22 are electrically connected to the first load terminal 11, i.e., at least 50% of the trench electrodes of the trenches in the diode section 1-22 are trench electrodes 161 of source trenches 16.

For example, the trenches in the diode section 1-22 are either source trenches 16 or floating trenches 15, e.g., all the trenches in the diode section 1-22 are source trenches 16. Furthermore, all or some mesa portions 17 in the diode section 1-22 may be electrically connected to the first load terminal 11, e.g., by means of the first contact plugs 111.

By contrast, the trench types in the IGBT section 1-21 may vary; in accordance with an embodiment, a subsequently repeating trench-mesa-pattern corresponding to "kGkSoSoSoS" may be employed for forming IGBT cells, wherein "k" denotes a mesa portion 17 connected to the first load terminal 11, "o" denotes a mesa portion 17 not connected to the first load terminal 11 (i.e., meaning the transition between the first load terminal 11 and the mesa portion 17 along the vertical direction Z is not conductive), "G" denotes a gate trench 14, and "S" denotes a source trench 16. Of course, different trench-mesa-patterns may be used in other embodiments. For example, a dummy trench (which is identical to a gate trench arranged between non-contacted mesa portions 17) could be included in the pattern of the diode section 1-22 and/or in the pattern of the IGBT section 1-21. Again, it is emphasized that in accordance with some or all embodiments described herein, the diode sections 1-22 do not include any control trench electrode 141 or any other trench electrode (e.g., dummy trench electrodes) electrically connected to the control terminal 13.

Figure 7:
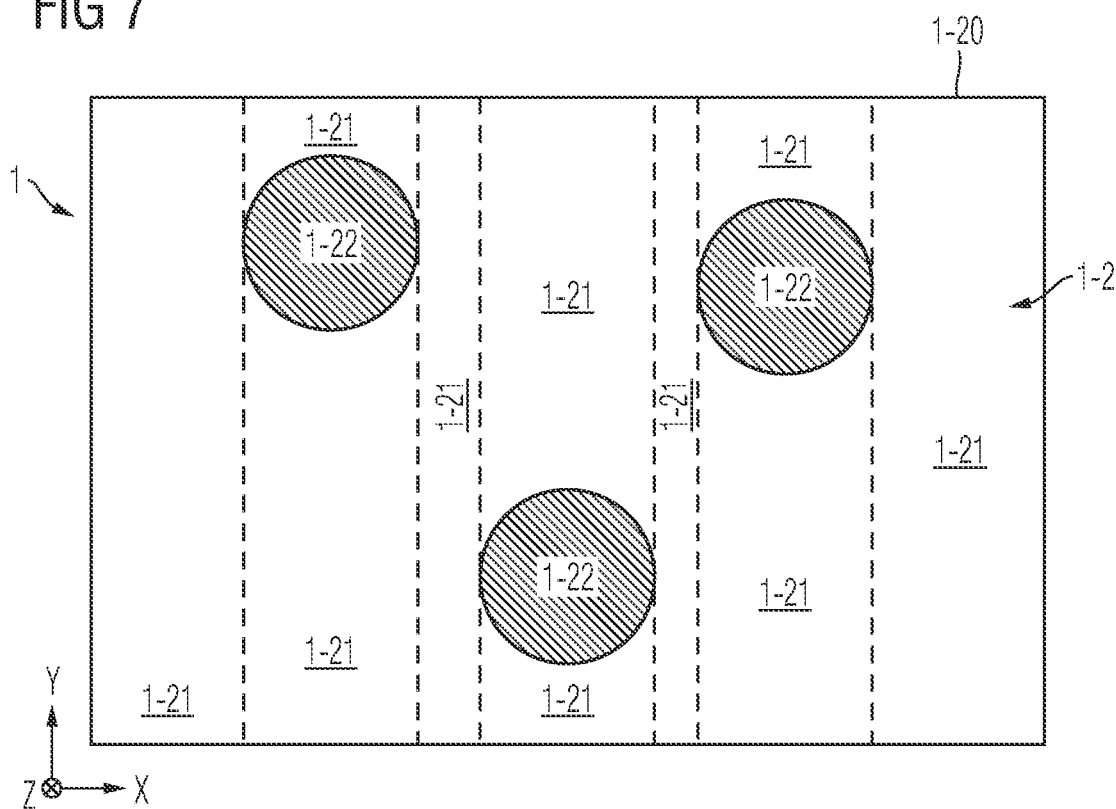

Still referring to FIGS. 3 to 5, and additionally to FIG. 7, the RC-IGBT 1 further comprises a drift region 100 of the first conductivity type formed in the semiconductor body 10 and extending into the diode sections 1-22 and the IGBT section 1-21.

A body region 102 of the second conductivity type is formed in (if present: the mesa portions 17 of) the semiconductor body 10 of the diode sections 1-22 and the IGBT section 1-21. At least portions of the body region 102 are electrically connected to the first load terminal 11. The body region 102 may form pn-junctions to subsections of the mesa portions 17 of the first conductivity type. For example, not in each mesa portion 17, the respective portion of the body region 102 is electrically connected to the first load terminal 11 in order to form "dummy mesa portions", i.e., those not used for load current conduction.

In the IGBT section 1-21, source regions 101 of the first conductivity type are arranged at the frontside 110 and electrically connected to the first load terminal 11. The source regions 101 are, e.g., only locally provided in the IGBT section 1-21 and do for example not extend into the diode sections 1-22.

The body region 102 may be arranged in electrical contact with the first load terminal 11, e.g., by means of the first contact plugs 111. In each IGBT cell of the IGBT section 1-21, can furthermore be provided at least one source region 101 of the first conductivity type arranged in electrical contact with the first load terminal 11, e.g., also by means of the first contact plugs 111. A major part of the semiconductor body 10 is formed as a drift region 100 of the first conductivity type, which may interface with the body region 102 and form a pn-junction 1021 therewith. The body region 102 isolates the source regions 101 from the drift region 100. Herein, the term "body region 102" refers to the semiconductor region of the second conductivity type electrically connected, at the frontside 110, to the first load terminal 11. This region extends into both the IGBT section 1-21 and the diode sections 1-22 (which could hence, there, also be referred to as "diode anode region" or the like). The implementation of the body region 102 in the IGBT section 1-21 may differ from the implementation of the body region 102 in the diode sections 1-22, e.g., in terms of dopant concentration, dopant dose, dopant profile and/or spatial extension.

Upon receipt of a corresponding control signal, e.g., provided by a non-illustrated gate driver unit, each control electrode 141 can induce an inversion channel in a section of the body region 102 adjacent to the respective control electrode 141. Thus, each of the number of IGBT cells may be configured for conducting at least a portion of the forward load current between the first load terminal 11 and the second load terminal 12.

The above described basic configuration of the IGBT cells in the IGBT section 1-21 of the power semiconductor device 1 is as such known to the skilled person, and the present specification employs the term "IGBT cell" within the scope of the technical meaning the skilled person typically associates therewith.

In an embodiment, the drift region 100 extends along the vertical direction Z, until it interfaces with a field stop layer 108, wherein the field stop layer 108 is also of the first conductivity type, but exhibits a higher dopant dose as compared to the drift region 100. The field stop layer 108 is typically of significantly smaller thickness than the drift region 100.

The drift region 100, or, if present, the field stop layer 108, extends along the vertical direction Z until interfacing with either an IGBT emitter region 103 of the IGBT section 1-21 or a diode cathode region 104 of the diode section 1-22.

The diode cathode region 104 is of the first conductivity type and electrically connected to the second load terminal 12 and coupled to the drift region 100, e.g., by means of the field stop layer 108.

The IGBT emitter region 103 is of the second conductivity type and electrically connected to the second load terminal 12 and coupled to the drift region 100, e.g., by means of the field stop layer 108.

Both the IGBT emitter region 103 of the IGBT section 1-21 and the diode cathode region 104 of the diode section 1-22 can be arranged in electrical contact with the second load terminal 12.

Overall, the IGBT emitter region 103 may act as an emitter of the second conductivity type. Furthermore, the IGBT emitter region 103 does in some embodiments not comprise any section of the first conductivity type, which exhibit a rather high dopant concentration, typically in the range of $10^{16}$ cm$^{-3}$ to $10^{20}$ cm$^{-3}$, rather, the diode cathode region 104 is exclusively formed in the diode section 1-22, in accordance with some embodiments.

In an embodiment, the average dopant concentration of the drift region 100 may be in the range of $10^{12}$ cm$^{-3}$ to $10^{14}$ cm$^{-3}$.

In an embodiment, the dopant concentration of each source region 101 in the IGBT section 1-21 may be in the range of $10^{19}$ cm$^{-3}$ to $10^{21}$ cm$^{-3}$.

In an embodiment, the dopant concentration of the body region 102 may be in the range of $10^{16}$ cm$^{-3}$ to $10^{18}$ cm$^{-3}$. As described above, e.g., the dopant concentration of the body region 102 in the IGBT section 1-21 may be different from the dopant concentration of the body region 102 in the diode sections 1-22.

In an embodiment, the dopant concentration of the (optional) field stop layer 108 may be in the range of $10^{14}$ cm$^{-3}$ to $3*10^{16}$ cm$^{-3}$.

In an embodiment, the dopant concentration of the IGBT emitter region 103 may be in the range of $10^{16}$ cm$^{-3}$ to $10^{18}$ cm$^{-3}$. However, in an embodiment, the dopant concentration may vary along the lateral extension of the IGBT emitter region 103.

In an embodiment, the dopant concentration of the diode cathode region 104 may be in the range of $10^{19}$ cm$^{-3}$ to $10^{21}$ cm$^{-3}$. However, in an embodiment, the dopant concentration may vary (and even change is polarity) along the lateral extension of the diode cathode region 104.

It shall be noted that the trench patterns illustrated in FIGS. 3 and 4 are only exemplary; other trench patterns are possible.

In an embodiment, the diode section 1-22 is not equipped with source regions 101. For example, in the diode section 1-22, there is no doped semiconductor region of the first conductivity type electrically connected to the first load terminal. Rather, for forming the diode configuration in the diode section 1-22 for conduction of the diode load current, only the body region 102 is electrically connected to the first load terminal 11, wherein the body region 102 forms the pn-junction 1021 with, e.g., the drift region 100, and along the vertical direction Z towards the second load terminal 12, below said pn-junction 1021, there is a semiconductor path of only the first conductivity type, not interrupted by any further regions of the second conductivity type.

As explained above, in contrast to the diode section 1-22, the IGBT section 1-21 comprises at least one IGBT cell with a section of the source region 101 connected to the first load terminal 11 and arranged adjacent to one of the control trenches 14 and isolated from the drift region 100 by the body region 102, in accordance with an embodiment. For example, the lateral boundary of the IGBT section 1-21 is defined by the lateral boundary of the outermost IGBT cell(s). Hence, the lateral boundary of the IGBT section 1-21 may be defined at the frontside 110. This lateral boundary can be defined by (an) outermost source region(s) 101. For example, all functional elements to enable conduction of the forward load current are present in a vertical projection of the IGBT section 1-21 of the power semiconductor device 1, e.g., including at least the first load terminal 11 (e.g., a frontside metal contact thereof, e.g., one or more of the first contact plugs 111), the source region(s) 101, the body region 102, the drift region 100, the IGBT emitter region 103, and the second load terminal 12 (e.g., a backside metal thereof). Furthermore, said functional elements may extend along the total lateral extension of the IGBT section 1-21.

In an embodiment, said first contact plugs 111 are part of a contact plug structure of the power semiconductor device 1. Each first contact plug 111 can be configured to establish contact with a respective mesa portion 17 so as to electrically connect that respective mesa portion 17 to the first load terminal 11. As illustrated, each first contact plug 111 may extend from the frontside 110 along the vertical direction Z into the respective mesa portion 17.

FIGS. 6 to 9 schematically and exemplarily illustrate sections of a horizontal projection of the RC IGBT 1 in accordance with some embodiments. Each of these embodiments may be configured in accordance with the preceding explanation.

For example, in each of these embodiments, the RC IGBT comprises the active region 1-2 with the IGBT section 1-21 and the plurality of at least three diode sections 1-22; the edge termination region 1-3 surrounding the active region 1-2; the semiconductor body 10 extending in both the active region 1-2 and the edge termination region 1-3 and having the frontside 110 and backside 120; the first load terminal 11 and the control terminal 13, both at the semiconductor body frontside 110, and the second load terminal 12 at the semiconductor body backside 120. Each of the diode sections 1-22 is configured for conduction of the diode load current between the first load terminal 11 and the second load terminal 12. The IGBT section 1-21 is configured for conduction of the forward load current between the second load terminal 12 and the first load terminal 11. The control terminal 13 is electrically connected to the electrically conductive control runner structure 131 being arranged at the semiconductor body frontside 110 and extending along the course of the lateral circumference of the active region 1-2 at least partially. The plurality of control trenches 14 is arranged in parallel to each other along the first lateral direction X and each control trench extends into the semiconductor body along the vertical direction Z pointing from the frontside 110 to the backside 120. Each control trench 14 has the stripe configuration extending along the second lateral direction Y from a respective first section of the lateral circumference 1-20 towards a respective second section of the lateral circumference 1-20 opposite of the respective first section, wherein the first lateral direction X is perpendicular to the second lateral direction Y. Each control trench 14 houses the respective insulated control electrode 141 configured to receive the control signal via the control runner structure 131 for controlling the IGBT section 1-21.

In the above, many possible configurations of the diode sections 1-22 and the IGBT section 1-21 have been presented. These possible configurations can also be implemented in the embodiments illustrated in FIGS. 6-9.

In an embodiment, the arrangement of the diode sections 1-22 occurs in accordance with a design rule. This rule specifies the following:

Each of the control trenches 14 is interrupted, along its respective extension in the second lateral direction Y, no more than once by at most a single one of the diode sections 1-22 (cf. FIG. 6).

Within the lateral area of the active region 1-2, neither the diode sections 1-22 themselves laterally overlap with each other nor do horizontal projections of these along the second lateral direction Y (indicated in FIG. 7 with the dashed lines).

Furthermore, within the lateral area of the active region 1-2, horizontal projections of at least two of the diode sections 1-22 along the first lateral direction X (indicated in FIG. 9 with the dashed lines) do not overlap with each other. As exemplarily illustrated in FIG. 9, the X-horizontal projection of the diode section 1-22 illustrated in the lower part of the Figure does not overlap with the X-horizontal projections of the other two diode sections 1-22.

FIG. 8 exemplarily illustrates aspects of the RC IGBT 1 related to the control terminal 13. The control terminal 13 may comprise a pad 135 arranged at a corner at the frontside of the active region 1-2 and configured to be contacted by control signal transmission means, e.g., a bond wire or the like.

The control runner structure 131 may originate from the pad 135 and extend in a stripe like manner along the path of the lateral circumference 1-20 of the active region 1-2, e.g., in such a way that each control electrode 141 of each non-interrupted control trench 14 may be electrically contacted at both of its ends (with respect to the second lateral direction Y) being located in proximity to the lateral circumference 1-20 of the active region 1-2. For example, this allows for avoiding the need to contact the control electrodes 141 within the active region 1-2.

What has been explained with respect to FIGS. 6 to 9 may equally or, respectively, analogously apply to the embodiments illustrated in the remaining FIGS. 10 to 21.

Figure 10:
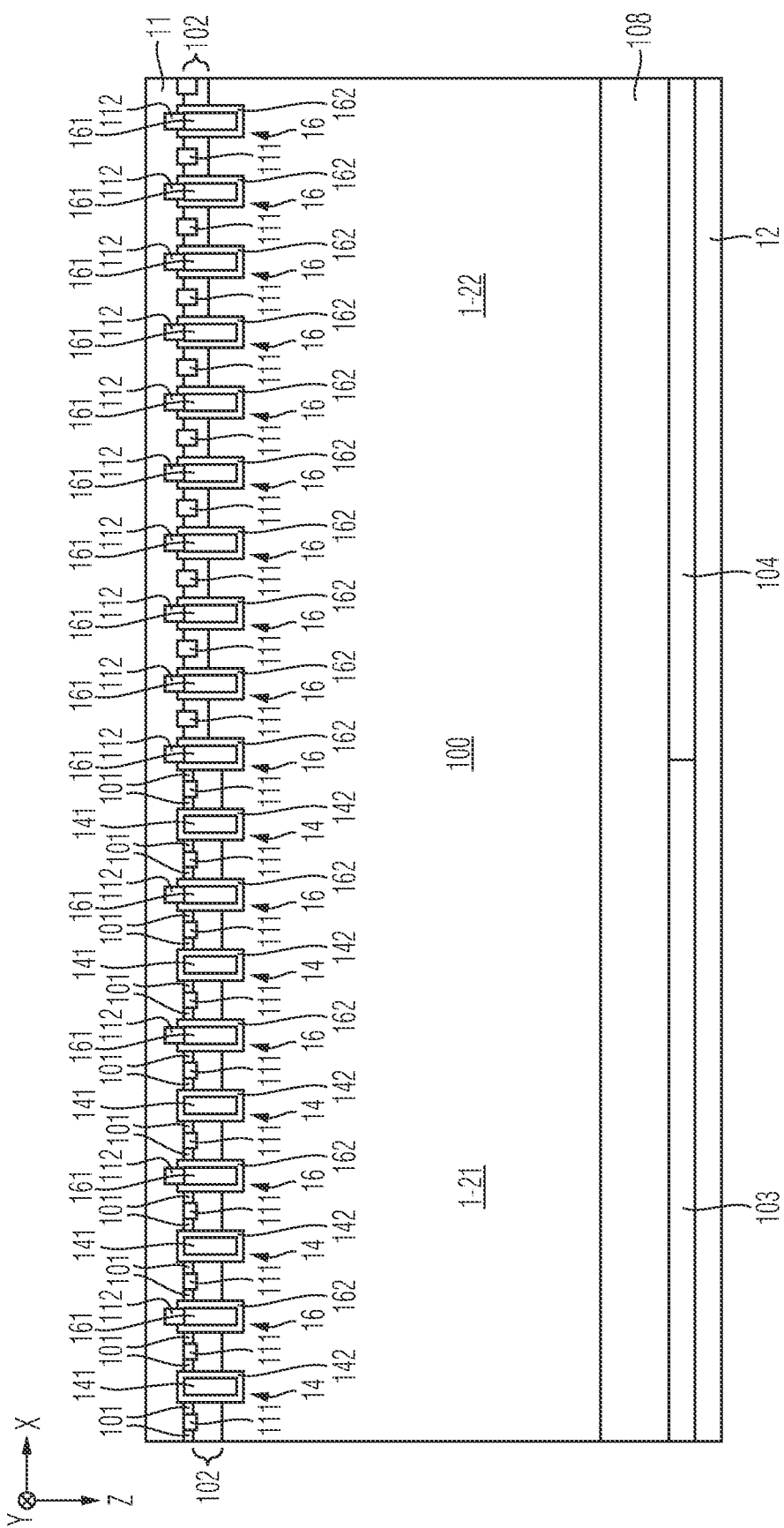
FIGS. 10-11 both schematically and exemplarily illustrate a section of a vertical cross-section of an RC IGBT in accordance with one or more embodiments.
Figure 11:
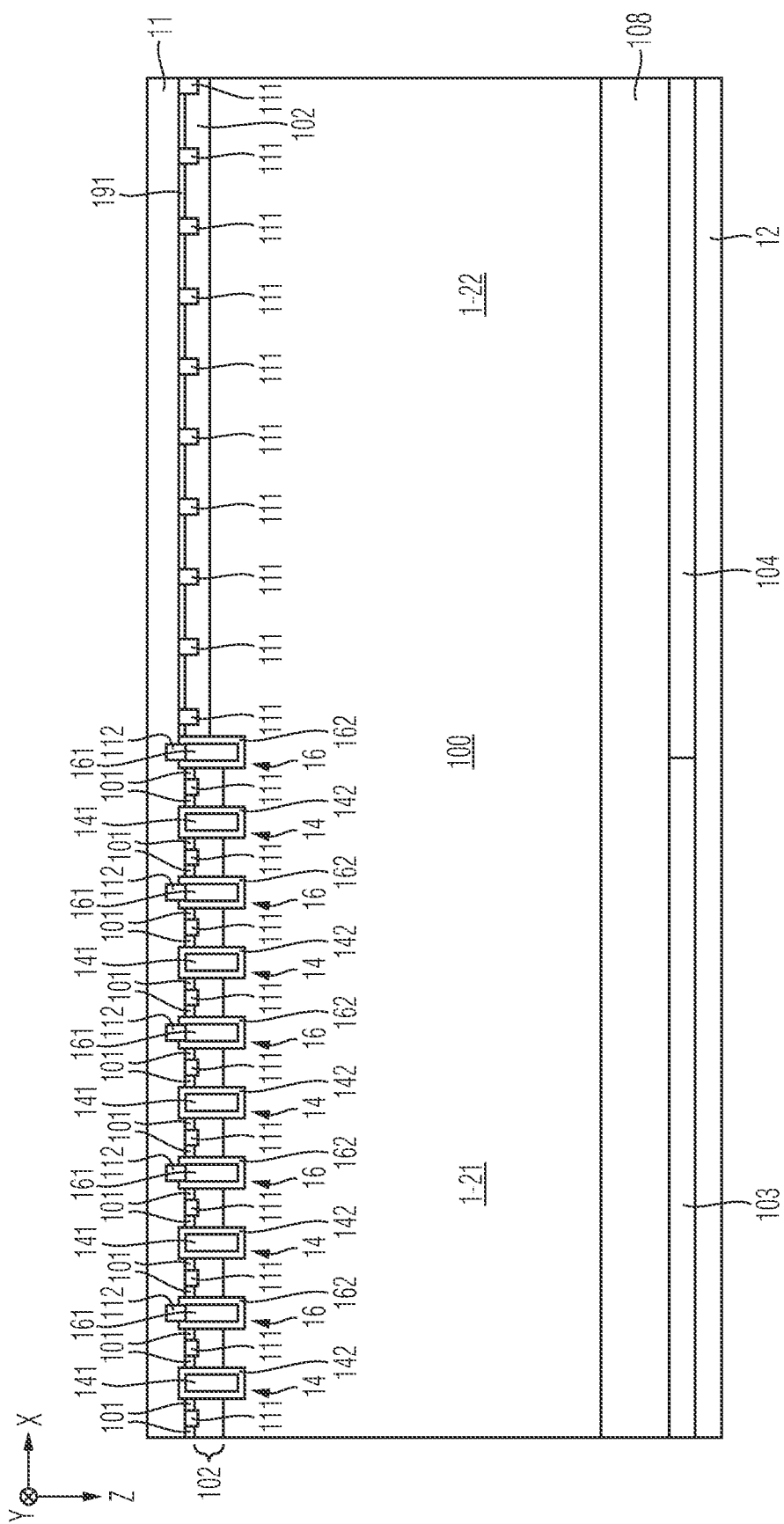

FIGS. 10 and 11 both schematically and exemplarily illustrate a section of a vertical cross-section of the RC IGBT 1 in accordance with some embodiments.

In accordance with FIG. 10, both the control trenches 14 and the source trenches 16 are provided in the IGBT section 1-21 and being arranged in an alternating manner That is, every second trench is a source trench 16 and every other second trench is a control trench 14. The source trench electrodes 161 are electrically connected with the first load terminal 11 via at least second contact plugs 112, whereas at least first contact plugs 111 establish the electrical connection between the mesa portions 17 and the first load terminal 11. As illustrated, the trench pattern in the adjacent diode section 1-22 (and, for example, in every other diode section 1-22 as well) is different in that only the source trenches 16 are provided but no control trenches 14. The trench pitch, however, is not altered. Thus, for the diode section the contact plug structure is altered in that every trench electrode—which are source trench electrodes 161—is electrically connected to the first load terminal 11 by a respective second contact plug 112. Furthermore, in the diode section 1-22, it is ensured that no source regions 101 are provided but that the first contact plugs only contact the body region 102. For example, due to every second trench electrode in the IGBT section 1-21 being a source trench electrode 161, the total gate capacity of the RC IGBT 1 is reduced. Furthermore, since the trench pitch is maintained in the diode sections 1-22, a homogenous etching process may be applied when producing the RC IGBT 1.

The IGBT section 1-21 of the embodiment illustrated in FIG. 11 is identically configured as the IGBT section 1-21 illustrated in FIG. 10. In the diode section 1-22, however, there are not provided any trenches at all. Rather, the body region 102 extends contiguously (e.g., not interrupted by a trench) within the diode section 1-22 and is separated by an insulation layer 191 from the first load terminal 11. The insulation layer 191 is penetrated by the first contact plugs 111 that establish the electrical connection between the body region 102 and the first load terminal 11. Alternatively, the electrical connection may be established without contact plugs, as shown in FIG. 5. Providing no trenches in the diode sections 1-22 may be advantageous for the switching properties of the diode sections 1-22.

FIGS. 12-17 each schematically and exemplarily illustrate a section of a horizontal projection of the RC IGBT 1 in accordance with some embodiments.

Figure 12:
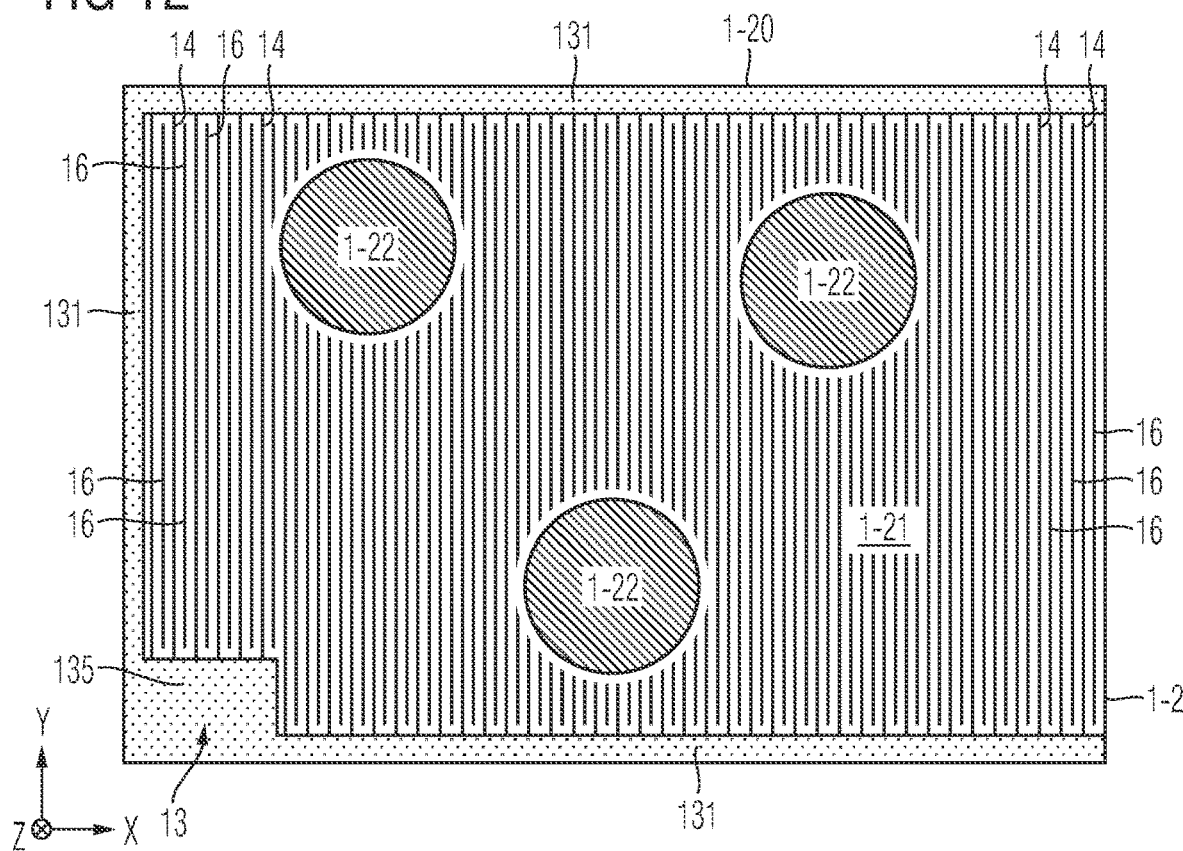
FIGS. 12-15 each schematically and exemplarily illustrate a section of a horizontal projection of an RC IGBT in accordance with one or more embodiments.

The embodiment in accordance with the illustration of FIG. 12 corresponds to the embodiment shown in FIG. 11; both control trenches 14 and source trenches 16 are provided in the IGBT section 1-21 and are there arranged in an alternating manner That is, every second trench is a source trench 16 and every other second trench is a control trench 14. The source trench electrodes 161 are electrically connected with the first load terminal 11 via at least second contact plugs 112, whereas at least first contact plugs 111 establish the electrical connection between the mesa portions 17 and the first load terminal 11 (not shown in FIG. 12). None of the trenches 14, 16 extends into the diode sections 1-22. Every trench 14, 16 that does not contiguously extend along the total extension of the active region 1-2 along the second lateral direction Y but is "interrupted" by one of the diode sections 1-22 (or, respectively, ends at one of the diode sections 1-22) is terminated such that is spatially displaced from the respective diode section 1-22, e.g., at least by a specified minimum distance, which will be explained further below. The structure of the control terminal 13 corresponds to that illustrated in FIG. 8, such it is here referred to the explanation above.

Figure 13:
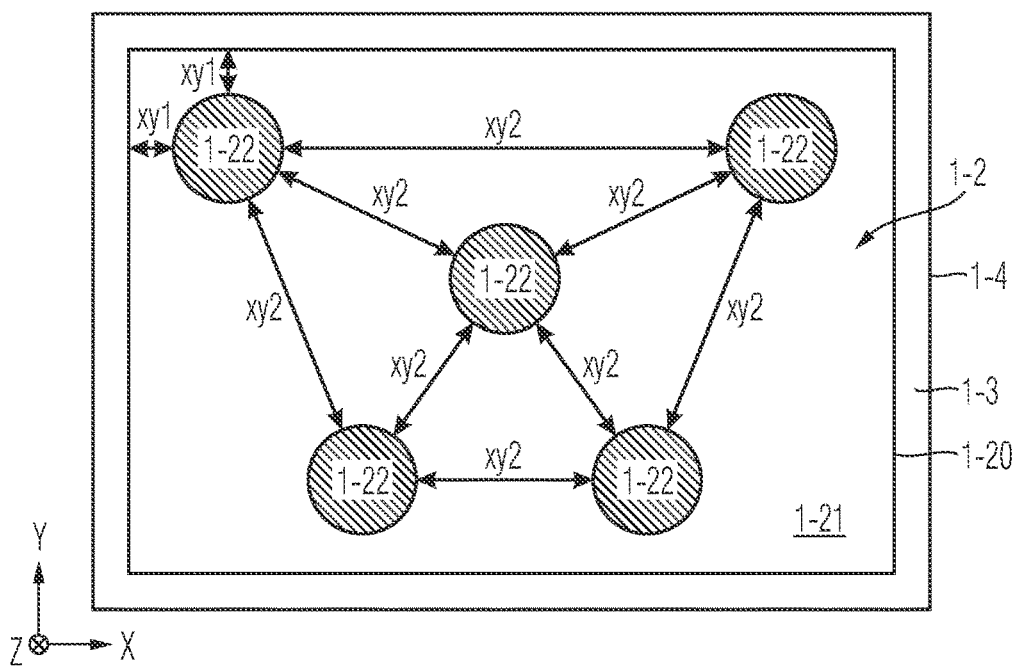

FIG. 13 illustrates a variant where five diode sections 1-22 are provided in the active region 1-2. However, irrespective of the chosen number of diode sections 1-22, and irrespective of the chosen trench pattern in the IGBT section 1-21 and the diode sections 1-22 (if implemented there at all) and furthermore irrespective of the structure of the control terminal 13 (not illustrated), FIG. 13 exemplarily illustrates an optional further provision of the design rule of arranging the diode sections 1-22 in the active region 1-2, according to which a lateral distance xy1 between any one of the diode sections 1-22 and the edge termination region 1-3 amounts to at least the semiconductor body thickness d.

This lateral distance xy1 may be even greater than d, e.g., greater than 2*d, or greater than 5*d. For example, this further provision includes the recognition that for commutation in hard switching applications (e.g. drives), a high commutation robustness may be needed; a diode section directly adjacent to the edge termination region 1-3 can be less robust since during commutation a higher current density is flowing there due to the additional electron-hole plasma being extracted from the edge termination region 1-3.

Alternatively or in addition to the above described optional further provision of the design rule of arranging the diode sections 1-22 in the active region 1-2, the design rule may specify that the lateral distance xy2 between any one of the diode sections 1-22 to another one of the diode sections 1-22 amounts to at least the semiconductor body thickness d. This lateral distance xy2 may be even greater than d, e.g., greater than 4*d, or greater than 8*d. Obeying this optional additional provision of the design rule may contribute to homogenous distribution of the diode sections 1-22 within the active region 1-2 and an improved characteristic output curve of the RC IGBT 1.

Whereas at least three spatially distributed diode sections 1-22 are provided in the active region 1-2, in an embodiment, there is only one IGBT section 1-21 in the active region 1-2 and said IGBT section 1-21 may be contiguous within the active region 1-2 such that the single IGBT section 1-21 (and none of the diode sections 1-22) forms the transition to the edge termination region 1-3 and such that the single IGBT sections 1-21 surrounds each of the at least three diode sections 1-22.

Figure 14:
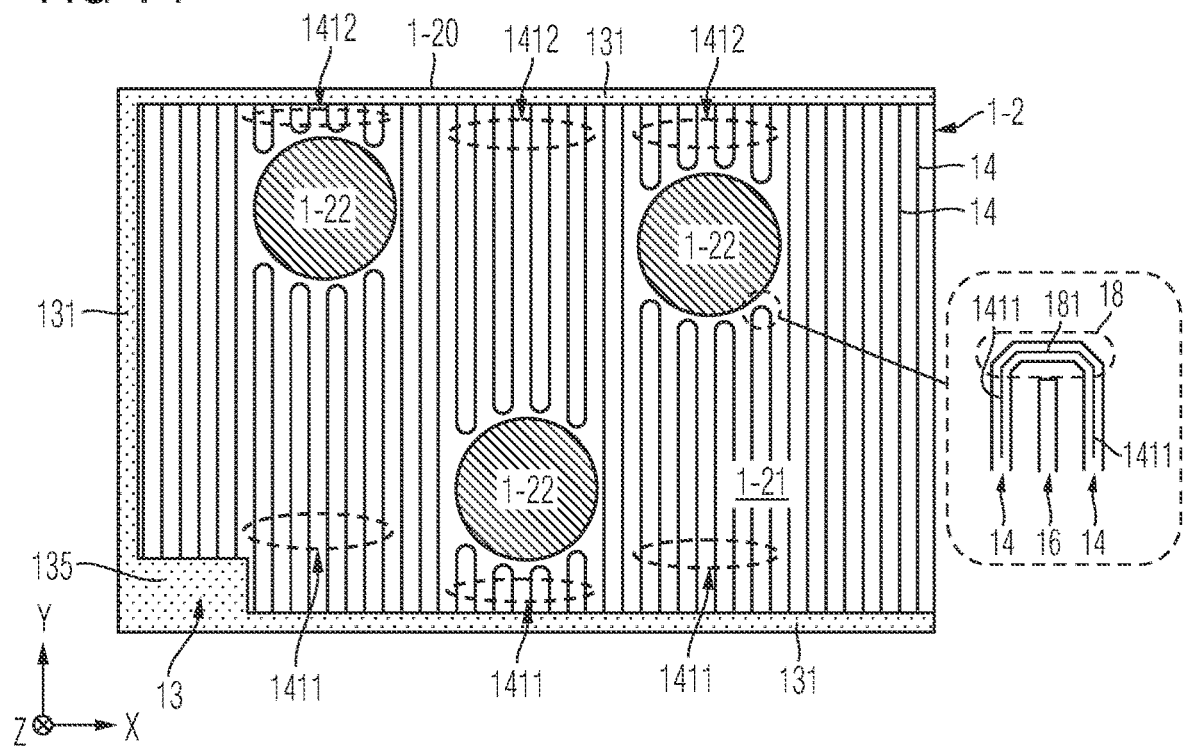
Figure 15:
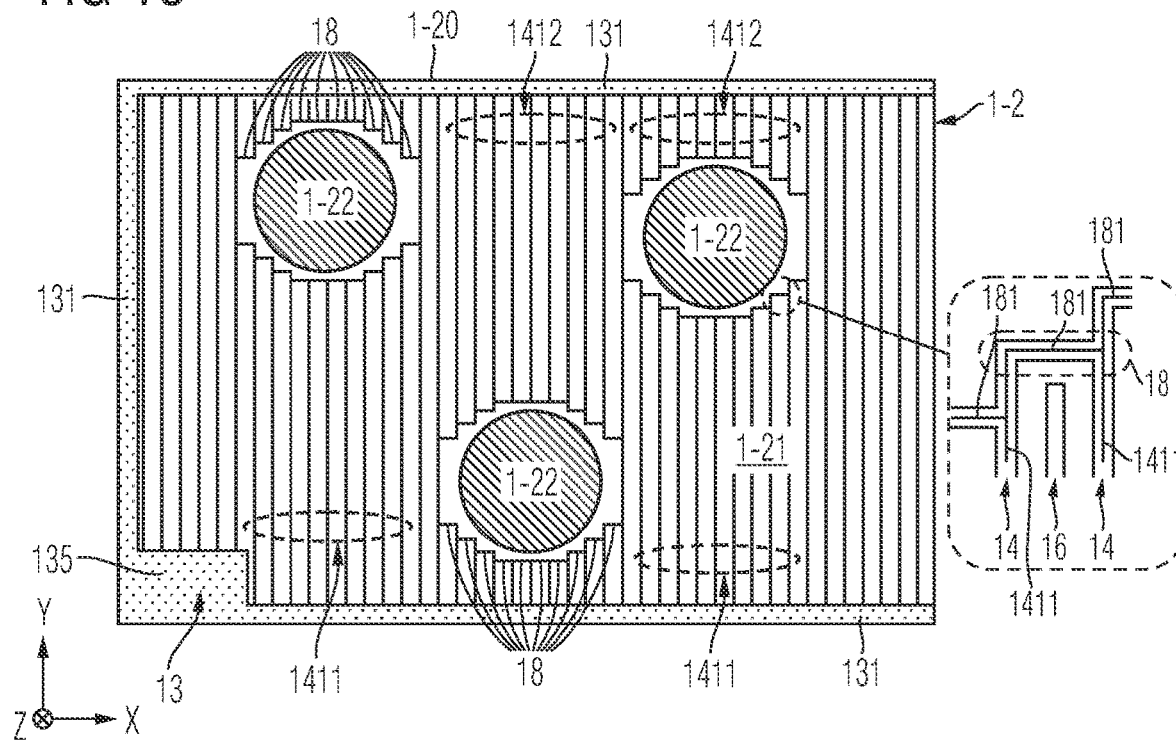

The embodiments illustrated in FIGS. 14 and 15 correspond to the embodiment illustrated in FIG. 12, where none of the trenches 14, 16 extend into the diode sections 1-22, wherein the source trenches 16 are not depicted in FIGS. 14 and 15 (only one in the zoomed-in section). FIGS. 14 and 15 illustrate two variants how the trenches 14, 16 may be terminated in proximity to the respective diode section 1-22.

For example, the control trenches 14 consist of uninterrupted control trenches and control trenches interrupted once by a respective one of the diode sections 1-22. The uninterrupted control trenches may contiguously extend along the second lateral direction Y from one section of the lateral circumference 1-20 to the opposite section of the lateral circumference 1-20. If source trenches 16 are provided, an analogous definition applies in case that also the source trenches 16 do not extend into the diode sections 1-22.

Hence, the control electrodes 141 in the uninterrupted control trenches 14 may extend contiguously along the second lateral direction Y, and the control electrodes 141 in the interrupted control trenches may be split into a first control electrode 1411 in a first control trench part before, with respect to the second lateral direction Y, the respective diode section 1-22 and in a second control electrode 1412 in a second control trench part behind, with respect to the second lateral direction Y, the respective diode section 1-22, as schematically and exemplarily illustrated in FIGS. 6, 8, 13, 14, 15. If source trenches 16 are provided, an analogous definition applies in case that also the source trenches 16 do not extend into the diode sections 1-22. It shall be noted that in contrast to the schematic illustration in FIGS. 14 and 15 (and in the other Figures), the parts of the interrupted trenches before and behind the respective diode section can be offset from each other with respect to the first lateral direction X instead of being arranged along the same straight in the second lateral direction Y (as illustrated).

Each control electrode 141, 1411, 1412 has two lateral ends in terms of the second lateral direction Y. For example, referring to FIGS. 14 and 15, the control electrodes 141 of the uninterrupted control trenches 14 have a first lateral end terminating at and electrically connected to the "lower" (in terms of the second lateral direction Y) section of the control runner structure 131 and a second lateral end terminating at and electrically connected to the "upper" (in terms of the second lateral direction Y) section of the control runner structure 131 opposite of the "lower" section.

That is, in an embodiment, each of the control electrodes 141 in the uninterrupted control trenches 14 is electrically connected, at both of its respective lateral ends, to a potential of the control terminal 13 by means of a respective first electrically conductive structure extending along the first lateral direction X and a respective second electrically conductive structure extending along the first lateral direction X. With respect to the control electrodes 141 in the uninterrupted control trenches 14, the first electrically conductive structure is formed by said "lower" section of the control runner structure 131, and the second electrically conductive structure is formed by said "upper" section of the control runner structure 131.

Furthermore, in an embodiment, also each of the first and second control electrodes 1411, 1412 in the interrupted control trenches 14 is electrically connected, at both of its respective lateral ends, to a potential of the control terminal 13 by means of a respective first electrically conductive structure extending along the first lateral direction X and a respective second electrically conductive structure extending along the first lateral direction X.

With respect to the first control electrodes 1411 in the interrupted control trenches 14 before the respective diode section 1-22, the first electrically conductive structure is formed by said "lower" (in terms of the second lateral direction Y in, e.g., FIG. 14) section of the control runner structure 131.

With respect to the second control electrodes 1412 in the interrupted control trenches 14 behind the respective diode section 1-22, the second electrically conductive structure is formed by said "upper" section of the control runner structure 131.

With respect to the lateral ends of the first and second control electrodes 1411, 1412 in the interrupted control trenches 14 before and behind the respective diode section 1-22 and terminating in proximity to the respective diode section 1-22 (and not at the control runner structure 131), each of the electrically conductive structures establishing the electrical connection to the potential of the control terminal 13 may be implemented by means of a cross-trench structure 18 arranged in proximity to the diode section 1-22 and extending at least partially along the first lateral direction X. Examples of the cross-trench structure 18 arranged in proximity to the diode section 1-22 and extending at least partially along the first lateral direction X are depicted in the zoomed-in sections of FIGS. 14 and 15, which both show an area before (with respect to the second lateral direction Y) the diode section 1-22, i.e., with the first control electrodes 1411 of the interrupted control trenches 14. In the example shown in FIG. 15, as illustrated, the cross-trench structure 18 before the respective diode section 1-22 extends contiguously to establish the connection of all first control trench electrodes 1411 of all first trench parts of the control trenches 14 that end before the respective diode section 1-22, and, accordingly, the cross-trench structure 18 behind the respective diode section 1-22 extends contiguously to establish the connection of all second control electrodes 1412 of all second trench parts of the control trenches 14 that end behind the respective diode section 1-22. By contrast, in the example shown in FIG. 14, as illustrated, a respective plurality of cross-trench structures 18 is provided both before and behind the respective diode section 1-22, and each cross-trench structure 18 connects only the control trench electrodes 1411 (or, respectively, 1412) of two adjacent control trenches 14 with each other.

The embodiments illustrated in FIGS. 14 and 15 include said source trenches 16, wherein the control trenches 14 and the source trenches 16 are provided in the IGBT section 1-21, only (and not in the diode sections 1-22), and are there arranged in an alternating manner That is, in the IGBT section 1-21, every second trench is a source trench 16 and every other second trench is a control trench 14. The source trench electrodes 161 are electrically connected with the first load terminal 11 via at least second contact plugs 112, as has been explained with respect to previous Figures (e.g., FIGS. 10 and 11).

In an embodiment, the cross-trench structures 18 are arranged so as to establish a respective "U-turn" around the lateral end of the respective source trench electrode 161, as illustrated in both FIG. 14 and FIG. 15. For example, each or at least one of the source trenches 16 is interrupted by a respective one of the diode sections 1-22, said source trench 16 or, respectively, each source trench 16 being arranged between two interrupted control trenches 14, and said (respective) cross-trench structure 18 being displaced from an end of the said source trench 16 along the second lateral direction Y. It shall be noted, however, that the concept of using cross-trench structures 18 to electrically connect ends of adjacent first/second control trench electrodes 1411/1412 terminating in proximity to one of the diode sections 1-22 may also be implemented if more than one source trench 16, if one or more other type of trenches or if no trenches at all are provided between the adjacent control trenches 14.

If source trenches 16 are provided, it can be ensured that none of the source trenches 16 extends into one or more of the diode sections 1-22 and/or that each of the source trenches 16 is interrupted, along its respective extension in the second lateral direction Y, no more than once by at most a single one of the diode sections 1-22, in accordance with an embodiment. In other embodiments, as has been explained above, one or more of the source trenches 16 may extend into one or more of the diode sections 1-22.

To establish the connection of the adjacent control trenches 14, each cross-trench structure 18 may either be provided with chamfers (as illustrated in FIG. 14) or extend only along the first lateral direction X, such that the control trenches 14 housing the control electrodes 1411 and the cross-trench structure 18 form substantially right angle turns (as illustrated in FIG. 15). Also "T-Junctions" may be formed with an adjacent uninterrupted control trench, as illustrated in FIG. 15.

To establish the electrical connection of the adjacent control trenches 1411, each cross-trench structure 18 may include a cross-trench electrode 181 electrically connecting the first control electrodes 1411 of two adjacent interrupted control trenches 14 before the diode section 1-22 (as illustrated), or, respectively, electrically connecting the second control electrodes 1412 of two adjacent interrupted control trenches 14 behind the diode section 1-22.

The use of the cross-trench structures 18 in proximity of the diode sections 1-22 reduces the risk of floating first/second control electrodes 1411/1412; e.g., if the electrical connection at the lateral end at the control runner structure 131 is lost/not established for some reason, the affected first or second control electrode 1411/1412 may still be electrically connected to the potential of the control terminal 13 due to the electrical connection to the adjacent first or second control electrode 1411/1412 established with the cross-trench structure 18, in accordance with an embodiment. Hence, the RC IGBT 1 may exhibit high reliability and controllability.

Figure 16:
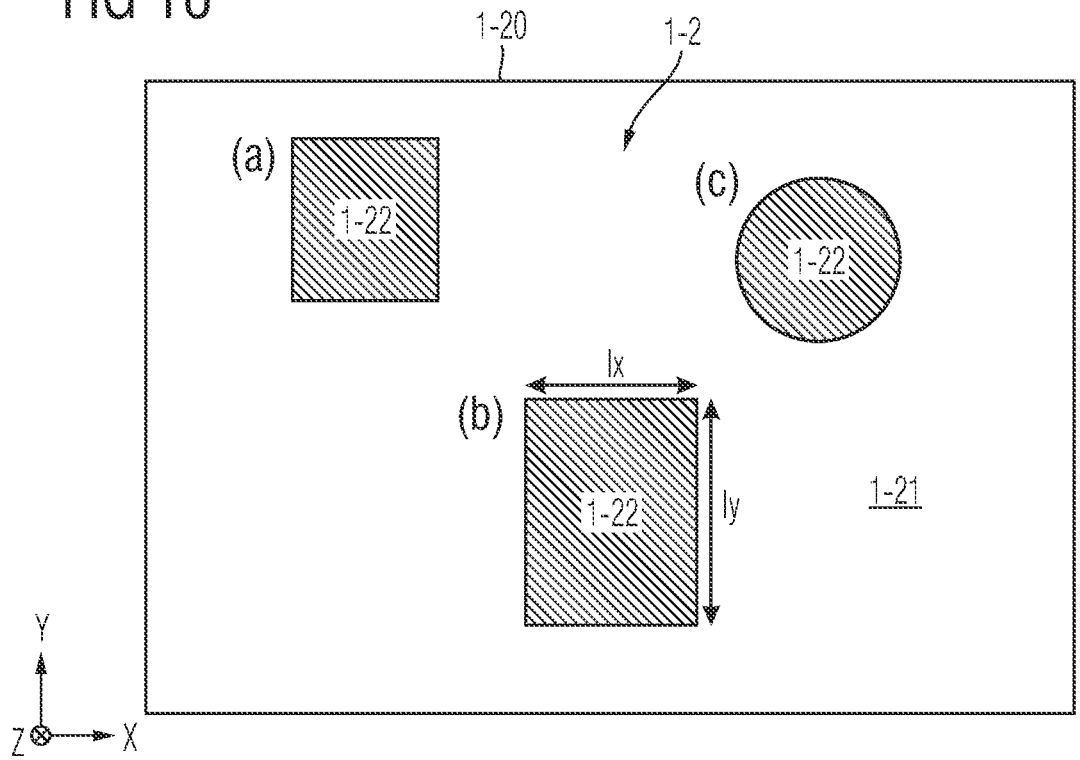
FIG. 16 schematically and exemplarily illustrates, based on a section of a horizontal projection, examples of possible shapes of diode sections of an RC IGBT in accordance with some embodiments.

FIG. 16 schematically and exemplarily illustrates, based on a section of a horizontal projection, examples of possible shapes of diode sections 1-22 of the RC IGBT 1 in accordance with some embodiments. For example, at least one or each of the at least three diode sections 1-22 may exhibit a quadratic lateral areal, i.e., horizontal cross-section (variant (a)), e.g., with rounded corners or corners provided with a chamfer (not illustrated). In another example, at least one or each of the at least three diode sections 1-22 may exhibit a rectangular lateral areal, i.e., horizontal cross-section (variant (b)), e.g., with rounded corners or corners provided with a chamfer (not illustrated). In another example, at least one or each of the at least three diode sections 1-22 may exhibit a circular lateral areal, i.e., horizontal cross-section (variant (c)). In another example, at least one or each of the at least three diode sections 1-22 may exhibit an ellipsoidal lateral areal, i.e., horizontal cross-section (non-illustrated variant). In an embodiment, different shapes of diode sections 1-22 may be combined within the active region 1-2 of the RC-IGBT 1.

For example, a shape of the diode sections 1-22 is appropriate that provide for a large lateral area (=horizontal cross-sectional area), but has a small circumference defining the same. For example, if a rectangular horizontal cross-section is chosen (variant (b)), those should be designed with little difference between the total lateral extensions ly and lx. This embodiment is based on the recognition that since in the conducting state of the RC IGBT 1 (especially the diode conducting state, when the reverse/diode load current is flowing) charge carriers may get lost through the boundaries between the IGBT section 1-21 and the diode sections 1-22 and contribute less to the current flow but still to the switching losses. Thus, the diode sections 1-22 have a shape with large lateral area but small circumference, i.e., with a "short boundary" to the IGBT section 1-21, in accordance with an embodiment. Against this background, the above introduced embodiment of the RC IGBT 1, according to which each of the diode sections 1-22 has lateral area (=horizontal cross-sectional area) and a circumference defining the lateral area, wherein each diode section 1-22 obeys the relation that the square of the circumference divided by the area is smaller or equal to 18. Of course, the circular shape is best in this respect; tt has a value of 4*pi≈12.57 for (circumference)$^2$/area. A quadratic shape (square) reaches the value of 16, and a rectangle with a side ratio ly/lx=2 reaches 18.

Figure 17:
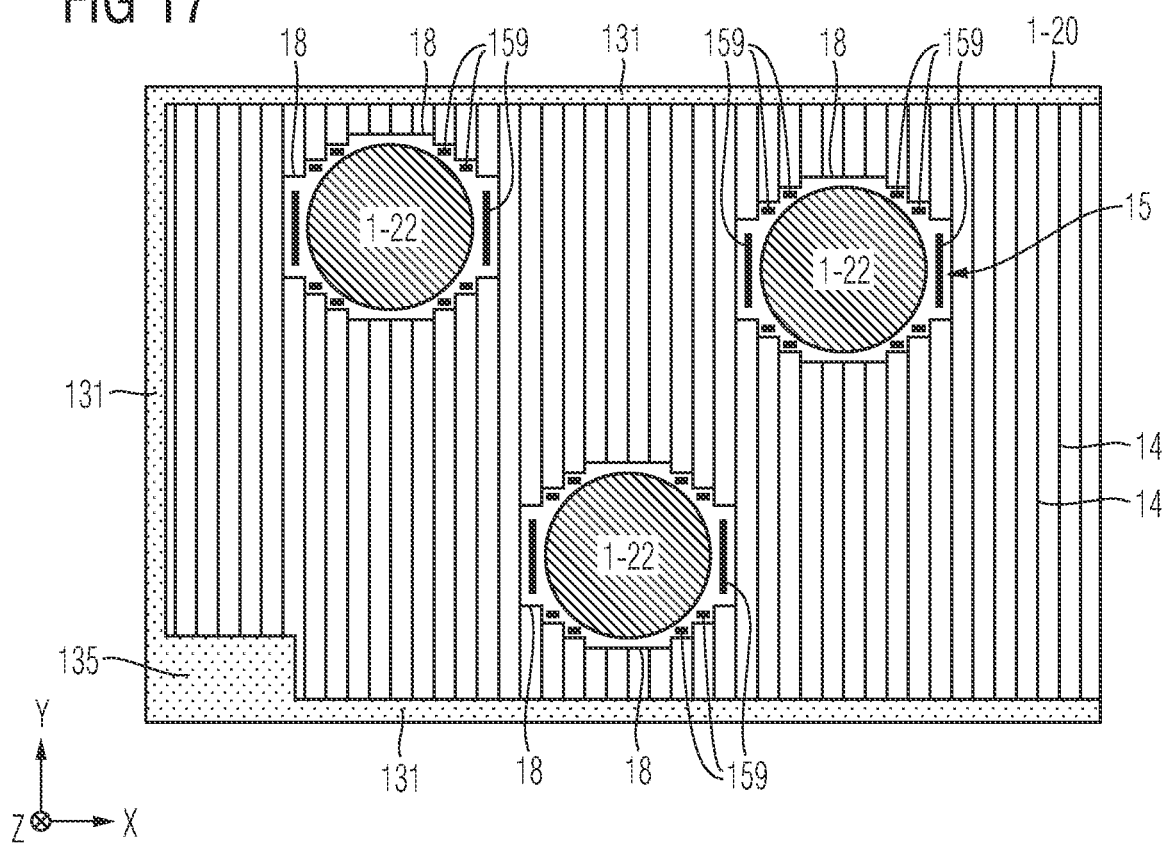
FIG. 17 schematically and exemplarily illustrates a section of a horizontal projection of an RC IGBT in accordance with one or more embodiments.

FIG. 17 schematically and exemplarily illustrates a section of a horizontal projection of the RC IGBT 1 in accordance with one or more embodiments. There, each diode section 1-22 is separated from the IGBT section 1-21 by means of a substantially contiguous structure 15 electrically connected to the potential of the first load terminal 11 by means of electrically conductive contacts (such as plugs or the like) 159.

Figure 18:
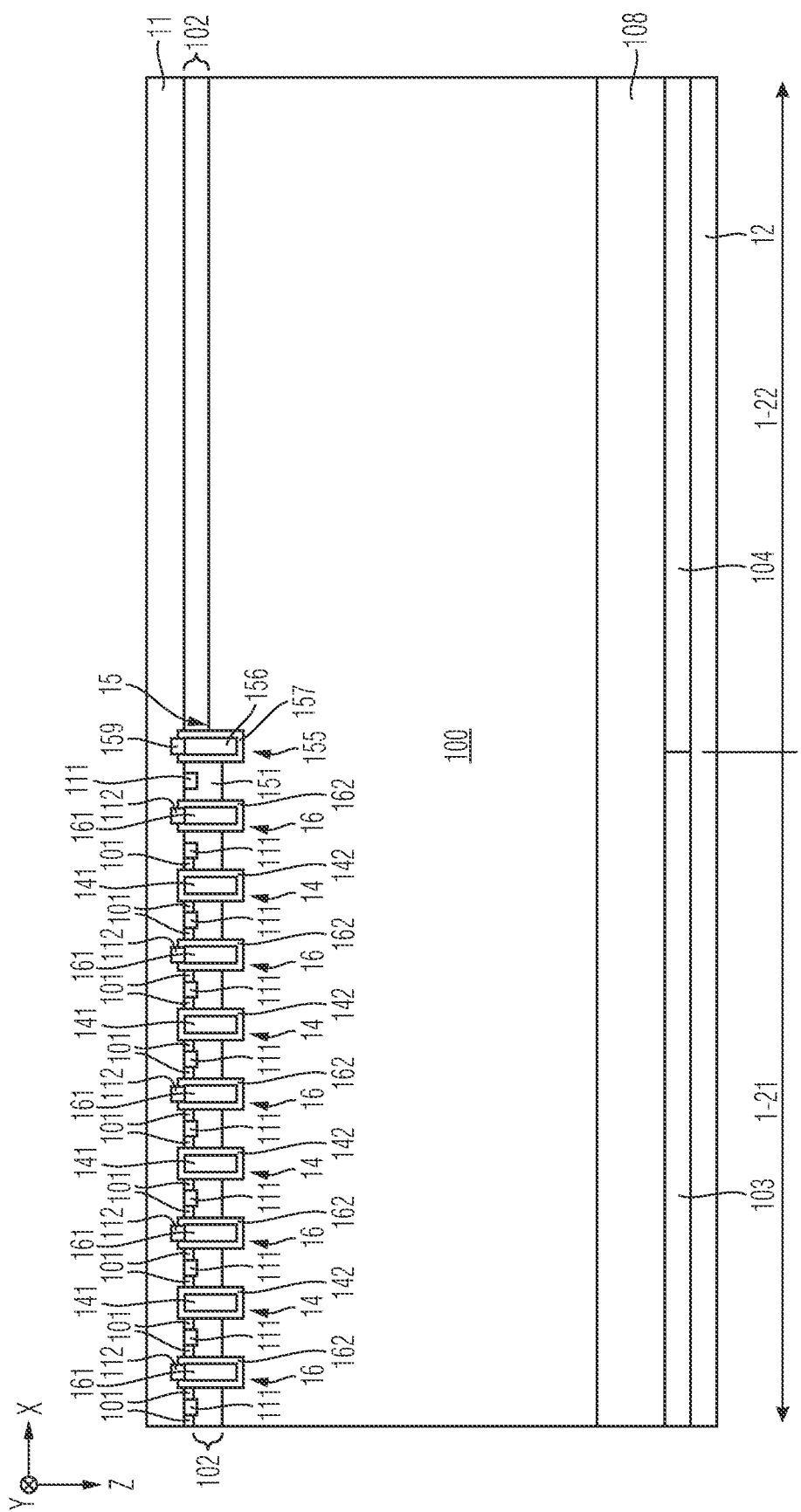
FIGS. 18-19 both schematically and exemplarily illustrate a section of a vertical cross-section of an RC IGBT in accordance with one or more embodiments.

For example, referring to FIG. 18, the substantially contiguous structure 15 may include a substantially contiguous trench 155 extending into the semiconductor body 10 along the vertical direction Z, e.g., as far as the control trenches 14 and source trenches 16, wherein said substantially contiguous trench 155 may include a substantially contiguous trench electrode 156 electrically connected to the potential of the first load terminal 11 and isolated from the semiconductor body by a trench insulator 157. For example, in FIGS. 17 and 18, reference signs 159 designates electrically conductive contacts (e.g., contact plugs) that establish the electrical connection between the substantially contiguous structure, e.g., the substantially contiguous trench electrode 156, and the first load terminal 11. These contacts 159 may be arranged in areas between the diodes sections 1-22 and the IGBT section 1-21, as exemplified in FIG. 17. Each of said trench electrodes 156 may contiguously, i.e., without interruption, surround the respective diode section 1-22.

Figure 19:
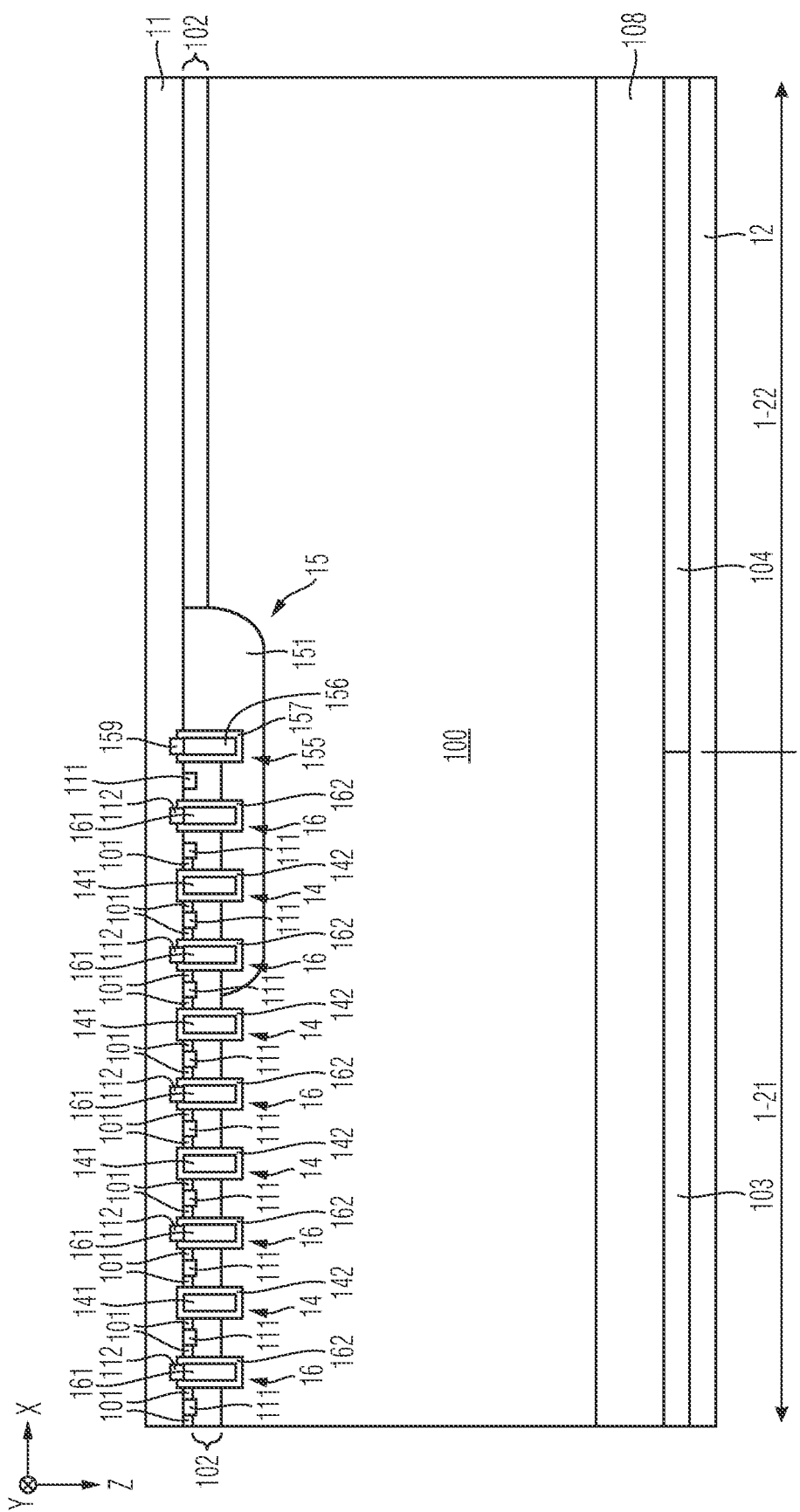

In addition to or alternatively to the substantially contiguous trench 155 that surround the diode section 1-22, referring to FIG. 19, the substantially contiguous structure 15 may include a semiconductor portion 151 of the second conductivity type. Said semiconductor portion 151 is electrically connected to the potential of the first load terminal 11 and may extend into both the diode section 1-22 it surrounds as well as into the IGBT section 1-21, e.g., so as to laterally overlap with at least one or more of the source/control trenches 14, 16 arranged in proximity to the diode section 1-22 and/or so as to seamlessly merge with the body region 102 in both the diode section 1-22 and the IGBT section 1-21. For example, the semiconductor portion 151 extends into a region between the trench 155 and the control trenches 14 adjacent to the diode sections 1-22. Furthermore, the semiconductor portion 151 of the second conductivity type may extend further along the vertical direction Z as compared to the body region 102, or even further as the source/control trenches 14, 16, and/or the semiconductor portion 151 of the second conductivity type may extend contiguously, i.e., without interruption, to surround the respective diode section 1-22.

The dopant concentration of the semiconductor portion 151 may be within the range of 50% to 500% of the dopant concentration of the body region 102 in the IGBT section 1-21.

Figure 20:
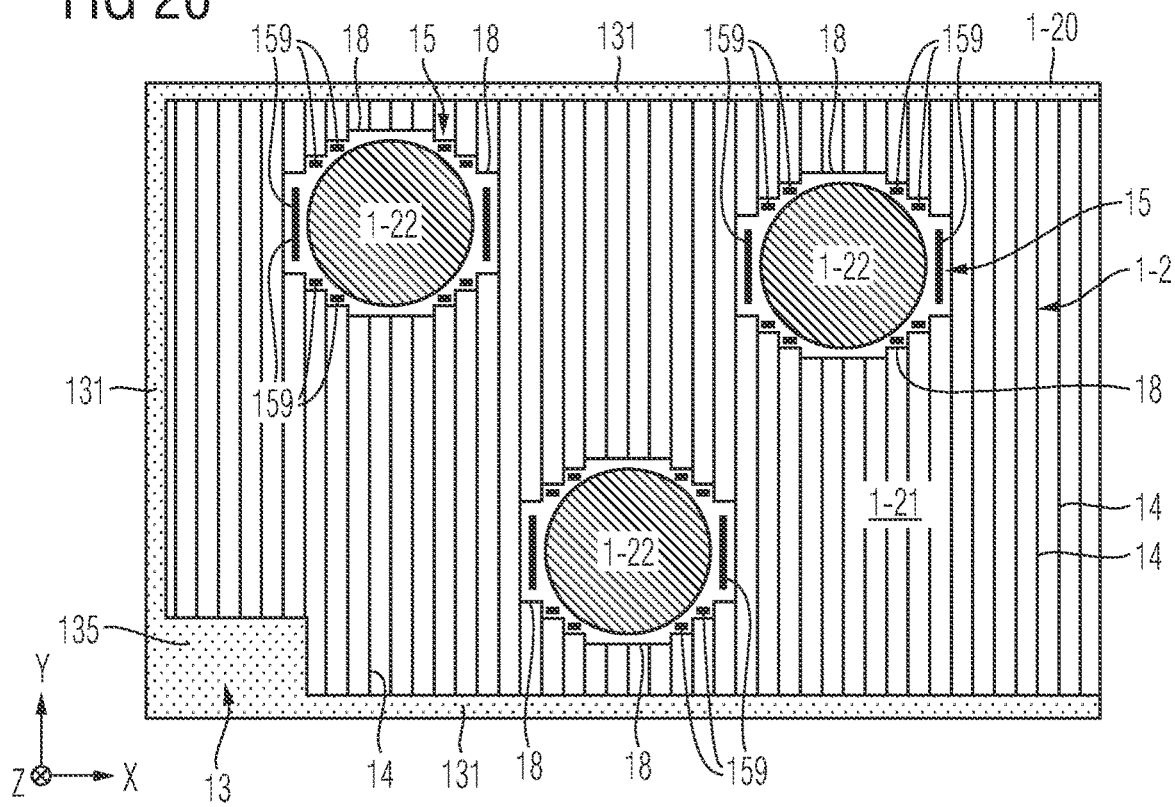
FIGS. 20-21 both schematically and exemplarily illustrate a section of a horizontal projection of an RC IGBT in accordance with one or more embodiments.

Based on FIGS. 20 and 21, which both schematically and exemplarily illustrate a section of a horizontal projection of the RC IGBT in accordance with one or more embodiments, further optional features shall be described.

For example, referring to FIG. 20, which corresponds to the embodiment of FIG. 17, it may be ensured that each diode section 1-22 is laterally displaced from any semiconductor region of the first conductivity type electrically connected to the first load terminal 11 by a distance dxy of at least 4 µm, or of at least 6 µm, or of at least 10 µm. Said semiconductor regions of the first conductivity type may for example be the source regions 101 schematically illustrated in FIG. 20 based on the plurality of lines extending in parallel along the first lateral direction X. That is, in an embodiment, every semiconductor region of the first conductivity type that is electrically connected to the first load terminal 11 (such as the source regions 101) of the RC IGBT 1 is spatially displaced from each of the diode sections 1-22 by at least 4 µm. In contrast to the schematic illustration in FIG. 20, this optional provision can also be provided without the cross-trench structures and/or without the substantially contiguous structure 15.

In case of the RC IGBT 1 being provided in a comparatively large size chip, the active area of the RC IGBT 1 may comprises several active regions 1-2, e.g., arranged as quadrants A, B, C and D separated from each other with control finger structure 132 electrically connected to the potential of the control terminal 13. In each of these active regions 1-2, the above described design rule for positioning and dimensioning the diode section 1-22 as well as other features related to the diode sections 1-22 and the IGBT section 1-21 may apply. For example, in such case, an outer portion of the control runner structure 131 surround (at least partially) the entire active area of the RC IGBT 1 including the four active regions 1-2A, 1-2B, 1-2C and 1-2D, and an inner portion of the control runner structure 131 (sometimes also referred to as control fingers) intersects the active area such that each of the four active regions 1-2A, 1-2B, 1-2C and 1-2D is partially surrounded by the control runner structure 131. That is, the control runner structure 131 extends along the course of the lateral circumferences 1-20A, 1-20B, 1-20C and 1-20D of the four active regions 1-2A, 1-2B, 1-2C and 1-2D (in the example completely along 1-20A and 1-20B, and partially along 1-20C and 1-20D).

Due to the course of the control runner structure 131 illustrated exemplarily in FIG. 21, the stripe configuration of the control trenches 14 in the active region 1-2A and/or in the active region 1-2B could be arranged perpendicular to the stripe configuration of the control trenches 14 in the active region 1-2C and/or in the active region 1-2D. More generally, the stripe configuration of the trenches 14 (and, if present, trenches 16) in one of the active regions 1-2A to 1-2D may be orientated differently, e.g., arranged perpendicular, as compared to the stripe configuration of the trenches 14 (and, if present, trenches 16) in another one of the active regions 1-2A to 1-2D. Yet, the above described design rule for positioning and dimensioning the diode section 1-22 as well as other features related to the diode sections 1-22 and the IGBT section 1-21 would still apply to the active region 1-2A and/or in the active region 1-2B (X and Y directions being than interchanged, as it is clear to the skilled person).

Presented herein is also a method of processing an RC IGBT. An embodiment of the method comprises forming the following components of the RC IGBT: an active region with an IGBT section and a plurality of at least three diode sections; an edge termination region surrounding the active region; a semiconductor body extending in both the active region and the edge termination region and having a frontside and a backside, the semiconductor body having a thickness, said thickness being the distance along the vertical direction from the frontside to the backside in one of the diode sections; a first load terminal and a control terminal, both at the semiconductor body frontside, and a second load terminal at the semiconductor body backside. Each of the diode sections is configured for conduction of a diode load current between the first load terminal and the second load terminal. The IGBT section is configured for conduction of a forward load current between the second load terminal and the first load terminal. The control terminal is electrically connected to an electrically conductive control runner structure being arranged at the semiconductor body frontside and extending along a course of a lateral circumference of the active region at least partially. A plurality of control trenches is arranged in parallel to each other along a first lateral direction and each control trench extends into the semiconductor body along a vertical direction pointing from the frontside to the backside. Each control trench has a stripe configuration extending along a second lateral direction from a respective first section of the lateral circumference towards a respective second section of the lateral circumference opposite of the respective first section, wherein the first lateral direction is perpendicular to the second lateral direction. Each control trench houses an insulated control electrode configured to receive a control signal via the control runner structure for controlling the IGBT section. The processing method comprises obeying a design rule according to which: Each of the control trenches is interrupted, along its respective extension in the second lateral direction, no more than once by at most a single one of the diode sections. Within the lateral area of the active region, neither the diode sections themselves laterally overlap with each other nor horizontal projections of these along the second lateral direction. Within the lateral area of the active region, horizontal projections of at least two of the diode sections along the first lateral direction do not overlap with each other.

Exemplary embodiments of this method correspond to the embodiments of the RC IGBT 1 described above.

In the above, embodiments pertaining to RC IGBTs and corresponding processing methods were explained. In accordance with at least some of these embodiments, a design is proposed that yields quasi gate (control electrode) independent diode properties while achieving a low ohmic connection between the control electrodes in the IGBT section and the control runner structure as well as low thermal resistance for the diode sections. Furthermore, embodiments additionally achieve reduced turn-on overvoltage of the diode sections.

In the above, embodiments pertaining to power semiconductor device, such as RC IGBTs, and corresponding processing methods were explained. For example, these power semiconductor device are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xCl_{-x}$) and silicon-SiGe heterojunction semiconductor materials. For power semiconductor switchs applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A reverse conducting insulated gate bipolar transistor (RC IGBT), comprising:
   an active region with an IGBT section and a plurality of at least three diode sections;
   an edge termination region surrounding the active region;
   a semiconductor body extending in both the active region and the edge termination region and having a frontside and a backside, the semiconductor body also having a thickness which is the distance along a vertical direction from the frontside to the backside in one of the diode sections;
   a first load terminal and a control terminal, both at the semiconductor body frontside; and
   a second load terminal at the semiconductor body backside,
   wherein each of the diode sections is configured for conduction of a diode load current between the first load terminal and the second load terminal,
   wherein the IGBT section is configured for conduction of a forward load current between the second load terminal and the first load terminal;
   wherein the control terminal is electrically connected to an electrically conductive control runner structure arranged at the semiconductor body frontside and extending along a course of a lateral circumference of the active region at least partially,
   wherein a plurality of control trenches is arranged in parallel to each other along a first lateral direction and extending into the semiconductor body along a vertical direction pointing from the frontside to the backside, each control trench:
   having a stripe configuration extending along a second lateral direction from a respective first section of the lateral circumference towards a respective second section of the lateral circumference opposite of the respective first section, the first lateral direction being perpendicular to the second lateral direction; and housing an insulated control electrode configured to receive a control signal via the control runner structure for controlling the IGBT section, wherein each of the control trenches is interrupted, along its respective extension in the second lateral direction, no more than once by at most a single one of the diode sections, wherein within the lateral area of the active region, neither the diode sections themselves laterally overlap with each other nor horizontal projections of these along the second lateral direction, wherein within the lateral area of the active region, horizontal projections of at least two of the diode sections along the first lateral direction do not overlap with each other.

2. The RC IGBT of claim 1, wherein none of the control trenches extends into one or more of the diode sections.

3. The RC IGBT of claim 1, wherein the IGBT section is contiguous within the active region.

4. The RC IGBT of claim 1, wherein each of the diode sections is surrounded by a portion of the IGBT section.

5. The RC IGBT of claim 1, wherein a lateral distance between any one of the diode sections to another one of the diode sections or, respectively, between any one of diode sections and the edge termination region amounts to at least the semiconductor body thickness.

6. The RC IGBT of claim 1, wherein each of at least two of the diode sections has a lateral extension along the first lateral direction of at least five times of the semiconductor body thickness.

7. The RC IGBT of claim 6, wherein each of the at least two diode sections further has a lateral extension along the second lateral direction of at least five times of the thickness of the semiconductor body.

8. The RC IGBT of claim 1, wherein a total lateral area of the diode sections forms a portion of 5% to 40% of a total lateral area of both the diode sections and the IGBT section.

9. The RC IGBT of claim 1, wherein each of the diode sections has lateral area and a circumference defining the lateral area, and wherein each diode section obeys a relation that the square of the circumference divided by the area is smaller or equal to 20.

10. The RC IGBT of claim 1, wherein the control trenches comprise uninterrupted control trenches and control trenches interrupted once by a respective one of the diode sections, wherein the control electrodes in the uninterrupted control trenches extend contiguously along the second lateral direction, wherein the control electrodes in the interrupted control trenches are split into a first control electrode in a first control trench part before, with respect to the second lateral direction, the respective diode section and in a second control electrode in a second control trench part behind, with respect to the second lateral direction, the respective diode section, and wherein each of the control electrodes in the interrupted control trenches and in the uninterrupted control trenches is electrically connected, at both of its respective lateral ends, to a potential of the control terminal by a respective first electrically conductive structure extending along the first lateral direction and a respective second electrically conductive structure extending along the first lateral direction.

11. The RC IGBT of claim 10, wherein for the uninterrupted control trenches, both the first electrically conductive structure and the second electrically conductive structure are implemented by the control runner structure.

12. The RC IGBT of claim 10, wherein for the interrupted control trenches, one of the first electrically conductive structure and the second electrically conductive structure is implemented by the control runner structure, and the other one of the first electrically conductive structure and the second electrically conductive structure is implemented by a cross-trench structure arranged in proximity to the diode section and extending at least partially along the first lateral direction.

13. The RC IGBT of claim 12, wherein the cross-trench structure includes a cross-trench electrode electrically connecting the first control electrodes of two adjacent interrupted control trenches before the diode section.

14. The RC IGBT of claim 12, wherein at least one of the source trenches is interrupted by one of the diode sections, the source trench being arranged between two interrupted control trenches, the cross-trench structure being displaced from an end of the source trench along the second lateral direction.

15. The RC IGBT of claim 1, further comprising, at least in the IGBT section, a plurality of source trenches arranged in parallel to each other along the first lateral direction and extending into the semiconductor body along the vertical direction, each source trench:

having a stripe configuration extending along the second lateral direction from a respective first section of the lateral circumference towards a respective second section of the lateral circumference opposite of the respective first section; and housing an insulated source electrode electrically connected to the potential of the first load terminal.

16. The RC IGBT of claim 15, wherein none of the source trenches extends into one or more of the diode sections, and/or wherein each of the source trenches is interrupted, along its respective extension in the second lateral direction, no more than once by at most a single one of the diode sections.

17. The RC IGBT of claim 15, wherein one or more of the source trenches extend into one or more of the diode sections.

18. The RC IGBT of claim 1, wherein each diode section is separated from the IGBT section by a substantially contiguous structure electrically connected to the potential of the first load terminal.

19. The RC IGBT of claim 1, wherein each diode section is laterally displaced from any semiconductor region of a first conductivity type electrically connected to the first load terminal by a distance of at least 5 μm.

20. A method of processing an RC IGBT, the method comprising:

forming an active region with an IGBT section and a plurality of at least three diode sections;

forming an edge termination region surrounding the active region;

forming a semiconductor body extending in both the active region and the edge termination region and having a frontside and a backside, the semiconductor body having a thickness which is the distance along a vertical direction from the frontside to the backside in one of the diode sections;

forming a first load terminal and a control terminal, both at the semiconductor body frontside, and a second load terminal at the semiconductor body backside, wherein each of the diode sections is configured for conduction of a diode load current between the first load terminal and the second load terminal, wherein the IGBT section is configured for conduction of a forward load current between the second load terminal and the first load terminal, wherein the control terminal is electrically connected to an electrically conductive control runner structure arranged at the semiconductor body frontside and extending along a course of a lateral circumference of the active region at least partially;

forming a plurality of control trenches arranged in parallel to each other along a first lateral direction and extending into the semiconductor body along a vertical direction pointing from the frontside to the backside, wherein each control trench has a stripe configuration extending along a second lateral direction from a respective first section of the lateral circumference towards a respective second section of the lateral circumference opposite of the respective first section, the first lateral direction being perpendicular to the second lateral direction, wherein each control trench houses an insulated control electrode configured to receive a control signal via the control runner structure for controlling the IGBT section; and obeying a design rule according to which:
  each of the control trenches is interrupted, along its respective extension in the second lateral direction, no more than once by at most a single one of the diode sections;
  within the lateral area of the active region, neither the diode sections themselves laterally overlap with each other nor horizontal projections of these along the second lateral direction; and
  within the lateral area of the active region, horizontal projections of at least two of the diode sections along the first lateral direction do not overlap with each other.

* * * * *